United States Patent
Saka et al.

(10) Patent No.: US 6,667,239 B2
(45) Date of Patent: Dec. 23, 2003

(54) CHEMICAL MECHANICAL POLISHING OF COPPER-OXIDE DAMASCENE STRUCTURES

(75) Inventors: Nanaji Saka, Cambridge, MA (US); Jiun-Yu Lai, Waltham, MA (US); Hilario L. Oh, Rochester Hills, MI (US)

(73) Assignee: ASML US, Inc., Scotts Valley, CA (US)

( * ) Notice: Subject to any disclaimer, the term of this patent is extended or adjusted under 35 U.S.C. 154(b) by 0 days.

(21) Appl. No.: 10/057,477

(22) Filed: Jan. 23, 2002

(65) Prior Publication Data

US 2003/0082904 A1 May 1, 2003

Related U.S. Application Data

(60) Provisional application No. 60/263,813, filed on Jan. 23, 2001.

(51) Int. Cl.[7] .............................................. H01L 21/461
(52) U.S. Cl. ...................... 438/692; 438/633; 438/691
(58) Field of Search ................................ 438/633, 691, 438/692, 693

(56) References Cited

U.S. PATENT DOCUMENTS

| | | | |
|---|---|---|---|
| 6,051,496 A | | 4/2000 | Jang |
| 6,103,625 A | * | 8/2000 | Marcyk et al. ............. 438/691 |
| 6,228,771 B1 | | 5/2001 | Allers |
| 6,375,693 B1 | * | 4/2002 | Cote et al. .................. 438/692 |
| 6,380,078 B1 | | 4/2002 | Liu et al. |
| 6,429,119 B1 | | 8/2002 | Chao et al. |
| 6,432,811 B1 | | 8/2002 | Wong |
| 6,458,017 B1 | * | 10/2002 | Li et al. ........................ 451/28 |
| 2002/0023719 A1 | * | 2/2002 | Epshteyn et al. ........... 438/692 |
| 2002/0031985 A1 | * | 3/2002 | Wang et al. .................. 451/41 |
| 2002/0127845 A1 | * | 9/2002 | Farrar ......................... 438/627 |
| 2002/0173140 A1 | * | 11/2002 | Sahota et al. ............... 438/633 |

OTHER PUBLICATIONS

Iqbal Ali et al., "Physical Characterization of Chemical Mechanical Planarized Surface for Trench Isolation", The Electrochemical Society, Inc., Journal of the Electrochem. Society, vol. 142, No. 9, Sep. 1995, pp. 3088–3092.

John M. Boyd et al., "Near–Global Planarization of Oxide–Filled Shallow Trenches Using Chemical Mechanical Polishing", The Electrochemical Society, Inc., Journal of the Electrochem. Society, vol. 143, No. 11, Nov. 1996, pp. 3718–3721.

Peter A. Burke, "Semi–Empirical Modelling of $SiO_2$ Chemical–Mechanical Polishing Planarization" VMIC Conference, TH–0359–0/91/0000–0379/ Jun. 11–12, 1991, pp. 379–384.

O. G. Chekina et al. "Wear–Contact Problems and Modeling of Chemical Mechanical Polishing" The Electrochemical Society, Inc., Journal of the Electrochem. Society, vol. 145, No. 6, Jun. 1998, pp. 2100–2106.

(List continued on next page.)

Primary Examiner—Kevin M. Picardat
(74) Attorney, Agent, or Firm—Dorsey & Whitney LLP

(57) ABSTRACT

A method of chemical mechanical polishing of a metal damascene structure which includes an insulation layer having trenches on a wafer and a metal layer having a lower portion located in trenches of the insulation layer and an upper portion overlying the lower portion and the insulation layer is provided. The method comprises a first step of planarizing the upper portion of the metal layer and a second step of polishing the insulation layer and the lower portion of the metal layer. In the first step of planarizing the upper portion of the metal layer, the wafer and a polishing pad is urged at an applied pressure p and a relative velocity v in a contact mode between the wafer and the polishing pad to promote an increased metal removal rate. In the second, the insulation layer and the lower portion of the metal layer are polished in a steady-state mode to form individual metal lines in the trenches with minimal dishing of the metal lines and overpolishing of the insulation layer.

21 Claims, 16 Drawing Sheets

OTHER PUBLICATIONS

Dar–Zen Chen et al., "Parameter Analysis of Chemical Mechanical Polishing: an Investigation Based on the Pattern Planarization Model", The Electrochemical Society, Inc., Journal of the Electrochemical Society, vol. 146, No. 9, 1999, pp. 3420–3424.

Dar–Zen Chen et al., "Pattern Planarization Model of Chemical Mechanical Polishing", The Electrochemical Society, Inc., Journal of the Electrochem Society, vol. 146, No. 2, 1999, pp. 744–748.

M.A. Fortes, et al., "The Contact Mechanics of Cellular Solids", Elsevier Science, Wear, vol. 230, 1999, pp. 1–10.

Ronald J. Gutmann, et al., "Chemical–Mechanical Polishing of Copper with Oxide and Polymer Interlevel Dielectrics", Elsevier Science, Thin Solid Films, vol. 270, 1995, pp. 596–600.

F.B. Kaufman, et al., "Chemical–Mechanical Polishing for Fabricating Patterned W. Metal Features as Chip Interconnects", The Electrochemical Society, Inc., Journal of the Electrochem. Society, vol. 138, No. 11, Nov. 1991, pp. 3460–3463.

Gerd Nanz et al. "Modeling of Chemical–Mechanical Polishing: A Review", IEEE, 1995, pp. 382–389.

Dennis Ouma et al., "Wafer–Scale Modeling of Pattern Effect in Oxide Chemical Mechanical Polishing", SPIE Microelectronics Manufacturing Conference, Microelectronic Device Technology Session, Austin, TX, Oct. 1997, pp. 1–12.

J. Tony Pan et al., "Copper CMP and Process Control", Final Paper Submitted to CMP–MIC 1999 Conference, Feb. 11–12, 1999, pp. 1–7.

T. Park et al., "Electrical Characterization of Copper Chemical Mechanical Polishing" Proc. CMP–MIC, Santa Clara, CA, Feb. 1999, pp. 1–8.

William J. Patrick et al., "Application of Chemical Mechanical Polishing to the Fabrication of VLSI Circuit Interconnections", The Electrochemical Society, Inc., Journal of the Electrochem. Society, vol. 138, No. 6, Jun. 1991, pp. 1778–1783.

Scott R. Runnels, "Advances in Physically Based Erosion Simulators for CMP", Southwest Research Institute, Journal of Electronic Materials, vol. 25, No. 10, 1996, pp. 1574–1580.

Scott R. Runnels, "Feature–Scale Fluid–Based Erosion Modeling for Chemical–Mechanical Polishing", The Electrochemical Society, Inc., Journal of the Electrochem. Society, vol. 141, No. 7, Jul. 1994, pp. 1900–1904.

Taber H. Smith et al., "A CMP Model Combining Density and Time Dependencies" Proc. CMP–MIC, Santa Clara, CA, Feb. 1999, pp. 1–8.

Z. Stavreva et al., "Chemical–Mechanical Polishing of Copper for Interconnect Formation", Elsevier Science, Micro–Electronic Engineering, vol. 33, 1997, pp. 249–257.

Z. Stavreva et al., "Chemical–Mechanical Polishing of Copper for Multilevel Metallization", Elsevier Science, Applied Surface Science, vol. 91, 1995, pp. 192–196.

J.M. Steigerwald et al., "Pattern Geometry Effects in the Chemical–Mechanical Polishing of Inlaid Copper Structures", The Electrochemical Society, Inc., Journal of the Electrochem. Society, vol. 141, No. 10, Oct. 1994, pp. 2842–2848.

J. Warnock, "A Two–Dimensional Process Model for Chemimechanical Polish Planarization", The Electrochemical Society, Inc., Journal of the Electrochem. Society, vol. 138, No. 8, Aug. 1991, pp. 2398–2402.

C. Yu et al. "Dishing Effects in a Chemical Mechanical Polishing Planarization Process for Advanced Trench Isolation", American Institute of Physics, Appl. Phys. Lett., vol. 61, No. 11, Sep. 14, 1992, pp. 1344–1346.

* cited by examiner

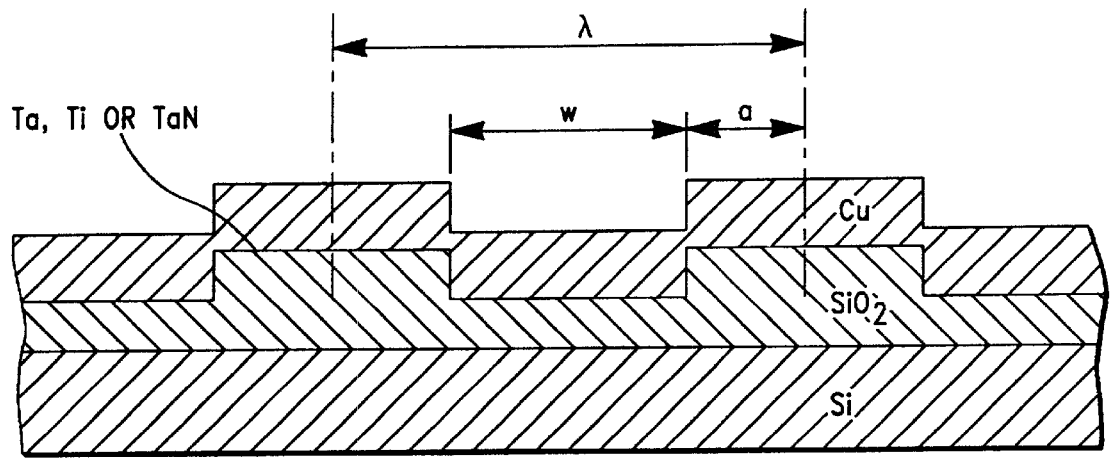
FIG.—1A
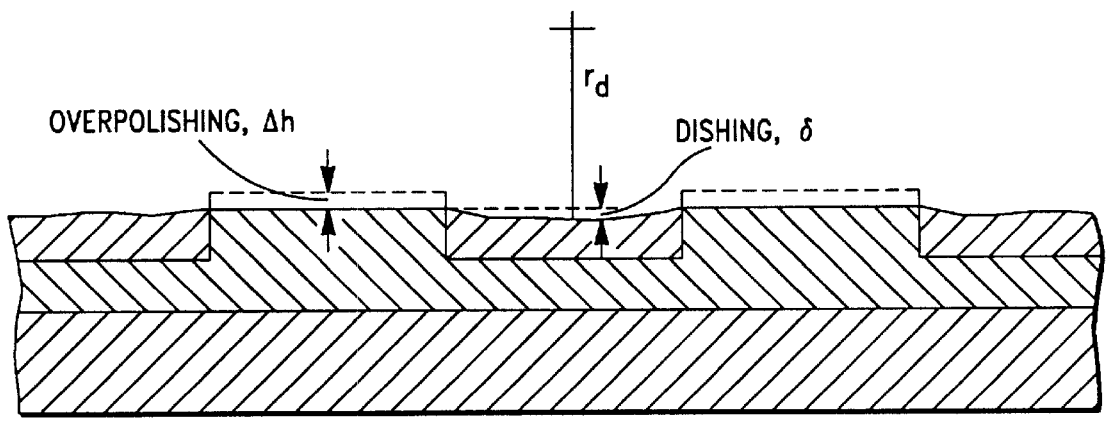
FIG.—1B

Linewidth (μm) / Pitch (μm)
Area Fraction

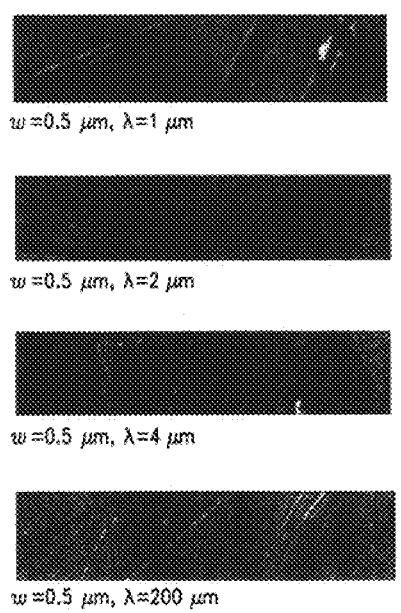
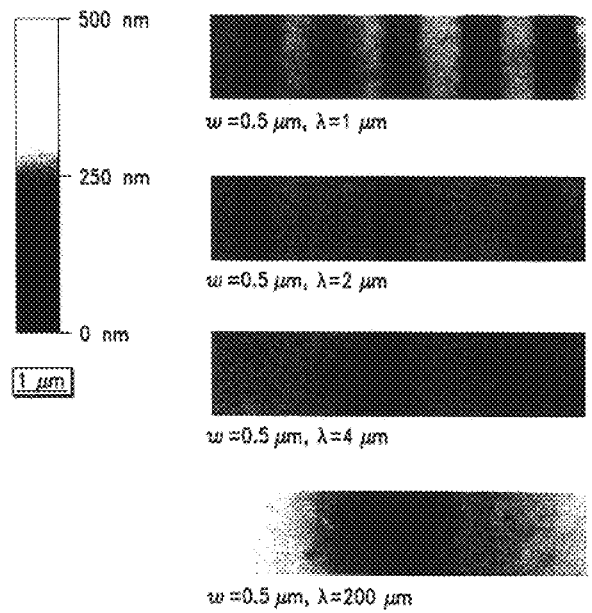
FIG.-13A
FIG.-13B

CHEMICAL MECHANICAL POLISHING OF COPPER-OXIDE DAMASCENE STRUCTURES

RELATED APPLICATIONS

This application claims priority to U.S. Provisional Patent Application Serial No. 60/263,813 filed Jan. 23, 2001, the entire disclosure of which is hereby incorporated by reference.

FIELD OF THE INVENTION

The present invention relates generally to the field of chemical mechanical polishing (CMP) in semiconductor fabrication. More particularly, the present invention relates to CMP of copper-oxide damascene structures to increase material removal rate and reduce copper dishing and oxide overpolishing.

BACKGROUND OF THE INVENTION

The continuing advance in ultra-large scale integration (ULSI) of semiconductor devices necessitates design and fabrication of extremely small devices. The existing metallization schemes for interconnects are inadequate for new integrated circuits (ICs). It is projected that for CMOS circuits with gate dimensions less than 0.25 $\mu$m, the RC delay due to metallization layers will account for 50 percent of the total circuit delay. New materials and processes are continuously being sought to replace current Al interconnects to reduce RC delay and energy loss due to heat dissipation. Copper has emerged as the favored interconnect material of the future due to its lower electrical resistivity which is about 30 percent less than that of aluminum (Al). This allows ICs to operate at a higher frequency and lower power. Additionally, as the interconnect dimensions are scaled down, the current density carried by the metal interconnects increases proportionally and might exceed the limit of electromigration. The higher melting point of Cu provides a greater resistance to electromigration which is about 2.5 times greater than Al, thus dramatically increasing the reliability of the ICs.

Despite the inherent advantage of Cu as the interconnect metal however, several challenges are involved in the fabrication of copper lines. Because of lack of volatile copper compounds at low temperature (less than 100° C.), copper etching to form the desired pattern on the top of the inter-level dielectric (ILD) layer is difficult. Thus a new way to pattern Cu lines by damascene scheme followed by CMP has demonstrated a great potential for developments in the interconnect technology.

One problem of the damascene scheme is dishing and overpolishing of the patterns during chemical mechanical polishing. FIGS. 1A and 1B schematically show a metal damascene structure before and after chemical mechanical polishing (CMP). In the metal damascene process, the metal interconnects are fabricated by depositing metals onto trenches of etched inter-level dielectric (ILD) layer. Then CMP is employed to remove the excessive metal and form patterned conductive wires in the ILD trenches. In order to remove all the metal coating on the dielectric surface so that the metal interconnects are isolated, the pattern within a die is partially overpolished. Concurrently, the softer interconnect metals (Cu, W) usually wear faster than the diffusion barrier layers (Ta, Ti, or TaN) and the surrounding dielectric material (SiO$_2$). Therefore, dishing occurs on the soft metal filled in the trenches. Both overpolishing and dishing degrade the surface planarity and may result in exposure field (die-scale) being partially out of focus in the subsequent lithography process. Moreover, overpolishing and dishing reduce the cross-sectional area of metal interconnects and thus increase the electrical resistance.

Dishing and overpolishing rates may be estimated by Preston equation $$\frac{dh}{dt} = k_p(x, y) p_{av} \phi(w, A_f, t^* \ldots) v_R$$

The Preston constant k$_p$, is a function of position which relates to the physical layout of the oxide and Cu interconnects. It is assumed that the Preston constants for different materials remain the same as those on blanket polishing. The pressure distribution is affected by the actual shape of the dished/overpolished surfaces, which in turn is a function of Cu linewidth w, area fraction A$_f$ and overpolishing time t*. The pressure distribution can be decoupled as a product of the average pressure on the die area and a geometrical function $\phi$ which includes the effects of pattern geometry. In practice, the geometrical function $\phi$ is not easy to find even when the surface topography is known. In this case, surface variation due to dishing and overpolishing is comparable to the surface roughness of the pad and the slurry particle size.

In prior art, phenomenological and contact models are proposed to determine the mechanisms of dishing and overpolishing in order to increase the process yield of CMP. The phenomenological model is proposed to relate the polishing rate of arrays of various features to the feature dimension and pattern density. By experimentally determining the correlation between the polishing rate, feature dimensions, and the neighboring feature layout, the surface profile evolution is predicted. One problem of the phenomenological model is that the correlation between the polishing rate and pattern geometry varies with different pattern design, and the tribological mechanisms of planarization are left unanswered in this model. Recently, the effects of pattern geometrical parameters, such as pattern density (i.e., high feature area fraction), pitch, pattern area, and the ratio of perimeter to area, are extensively studied, and the studies show that the pattern density significantly affects the sub-die-scale polishing rate. The influential range of a specific pattern on the neighboring area is characterized by a planarization length measured experimentally. A density-based numerical model is proposed to calculate the surface topography evolution for arbitrary layouts.

Contact models are employed to investigate the mechanisms of planarization. A planar elastic pad is assumed under this model for predicting the pressure distribution on the die surface with various pattern layouts. A generalized relation between pressure distribution and the pad displacement is proposed. Based on this model, the nonuniform polishing rate across different pattern regions is attributed to the nonuniform pressure on the high features. The low features are assumed to stay intact without material being removed until the deformed pat contacts them. However, the contact model may not be applicable to some pattern layouts in metal polishing cases. The pad may be in contact with the low features before the high features reach steady-state profiles. Additionally, the pad may not be conformal to the surfaces of high features as assumed in this model.

Both the phenomenological and the contact models have their limitations in explaining dishing and overpolishing. In Cu polishing, for example, the surface often becomes planar before the Cu layer is polished through. Thus the pressure distribution at the onset of dishing and overpolishing is likely to be much more uniform than that in the planarization stage. Furthermore, when the size of the planarized feature is close to or smaller than the abrasive particle (0.2–0.3 μm) and the pad surface roughness, the particle distribution and the pad local topography must be taken into account in the calculation of local pressure. An analytical model of this sort is however, difficult to establish. Consequently, the research on dishing and overpolishing has been confined to experimental characterization and parametric studies on pattern parameters such as area fraction, linewidth and pitch. Though a few semi-empirical models have been proposed, the fundamentals of dishing and overpolishing and their relation to pattern geometry and material properties are still not fully understood. Moreover, since most of the experiments are conducted on features of large size, the results and associated problems, such as severe dishing on 100 μm features, may be inapplicable to current sub-quarter micron circuit design in which the scaling issue must be addressed.

SUMMARY OF THE INVENTION

Accordingly, it is an object of the present invention to provide a method of chemical mechanical polishing of metal damascene structures.

It is another object of the present invention to provide a method of chemical mechanical polishing of metal damascene structures that maximize metal removal rate and minimize surface nonuniformity due to metal dishing and oxide overpolishing.

It is a further object of the present invention to provide a method of chemical mechanical polishing of metal damascene structures to reduce oxide polishing rate and increase the polishing selectivity between the metal and oxide.

It is still a further object of the present invention to provide a method of chemical mechanical polishing of metal damascene structures to optimize process conditions based on the pattern geometry of the metal damascene structures.

These and other objects of the present invention can be achieved by the present method of chemical mechanical polishing of a metal damascene structure which includes an insulation layer having trenches on a wafer and a metal layer having a lower portion located in the trenches of the insulation layer and an upper portion overlying the lower portion and the insulation layer. According to the present invention, the chemical mechanical polishing of a metal damascene structure comprises a first step of planarizing and polishing the upper portion of the metal layer and a second step of polishing the insulation layer and the lower portion of the metal layer. In the first step of planarizing and polishing the upper portion of the metal layer, the wafer and a polishing pad are urged at an applied pressure p and a relative velocity v in a contact mode between the wafer and the polishing pad to promote an increased metal removal rate. In the second step, the insulation layer and the lower portion of the metal layer are polished in a steady-state mode to form individual metal lines in the trenches with minimal dishing of the metal lines and overdishing of the insulation layer.

In an preferred embodiment, the method of chemical mechanical polishing of a metal damascene structure of the present invention comprise a first step of planarizing and polishing the upper portion of the metal layer by urging the wafer with a polishing pad at an applied pressure $p_{av}$ and a relative velocity $v_R$ in a contact mode between the wafer and the polishing pad, and a second step of polishing the insulation layer and the lower portion of the metal layer in a steady-state mode by satisfying the following equation to form individual metal lines in the trenches with minimal dishing of the metal lines and overpolishing of the insulation layer:

$$R_{Metal} = R_{Insulation} = \frac{k_w}{H'} p_{av} v_R$$

wherein $R_{Metal}$ is copper removal rate, $R_{Insulation}$ is insulation layer removal rate, $k_w$ is wear coefficient, and $H'$ is apparent hardness of a polishing surface represented by the following equation:

$$H' = H_{Metal} A_f + H_{Insulation}(1-A_f)$$

wherein $H_{Metal}$ is hardness of copper, $H_{Insulation}$ is hardness of insulation layer, and $A_f$ is area fraction of metal pattern.

BRIEF DESCRIPTION OF THE FIGURES

The foregoing and other objects of the invention will be more clearly understood from the following description when read in conjunction with the accompanying drawings in which:

FIG. 1A is a schematic view of a metal damascene structure prior to chemical mechanical polishing (CMP).

FIG. 1B schematically shows dishing and overpolishing after metal CMP.

FIG. 13A are AFMs showing various patterns after CMP at 3 minutes and 30 seconds.

FIG. 13B are AFMs showing various patterns after CMP at 5 minutes.

DETAILED DESCRIPTION OF THE INVENTION

The following nomenclature is used throughout the description of the present invention and is defined as follows:

$A_f$=area fraction of metal pattern
a=half linewidth of the metal pattern (m)
$C_1$, $C_2$, $C_3$=integration constants
E=Young's modulus of coating material (N/m²)
$F_n$, F=normal and tangential forces on the wafer (N)
H=hardness of coating material (N/m²)
H'=apparent hardness of a composite surface (N/m²)
h=thickness of the material removed on the wafer surface (m)
$k_p$=Preston constant (m²/N)
$k_w$=wear coefficient
P=load per unit length on a high feature (N/m)
p=normal traction on the wafer surface (N/m²)
$P_{nv}$=nominal pressure on wafer (N/m²)
p'=average pressure on a high feature (N/m²)
q=tangential traction on the wafer surface (N/m²)
$r_d$=radius of dishing surface (m)
S=sliding distance (m)
t=experiment duration (s)
t*=overpolishing duration (s)
$u_r$, $u_z$=normal and tangential displacements of the pad (m)
V=volume loss (m³)
$v_R$=relative linear velocity of wafer (m/s)
w=pattern linewidth (m)
x, y, z=Cartesian coordinates (m)
$x_n$=position of a datum on the displaced surface of pad (m)
Δh=oxide overpolishing (m)
δ=Cu dishing (m)
λ=pattern pitch (m)
μ=friction coefficient
v=Poisson's ratio
p'=average pressure on a high feature (N/m²)
S=sliding distance (m)

FIGS. 1A and 1B schematically show a copper damascene structure before and after chemical mechanical polishing. As illustrated in FIG. 1A, the copper damascene structure comprises an insulative SiO₂ layer having trenches on a Si wafer and a Cu layer deposited over the SiO₂ layer. The Cu layer comprises a lower portion located in the trenches of the SiO₂ layer and an upper portion overlying the lower portion of the Cu layer and the SiO₂ layer. While Cu is used to illustrate the damascene structure, it is not intended to limit the scope of the present invention in any way. The CMP method of present invention described below can be used for other metal damascene structures as well.

The present invention provides a method of chemical mechanical polishing of a metal damascene structure as illustrated in FIG. 1A. The CMP method of the present invention comprises a first step of planarizing and polishing the upper portion of the metal layer in a contact mode and a second step of polishing the insulation layer and the lower portion of the metal layer in a steady-state mode to form individual metal lines in the trenches with minimal dishing of the metal lines and overdpolishing of the insulation layer.

In the first step, the upper portion of the metal layer is planarized and polished by urging the wafer and a polishing pad at an applied pressure $p_{av}$ and a relative velocity $v_R$ in a contact mode between the wafer and the polishing pad. The contact mechanics models are employed to determine the pressure variation on high features and to determine the pad displacement outside the high features to assure no wafer/pad contact on the low features.

Figure 2A:
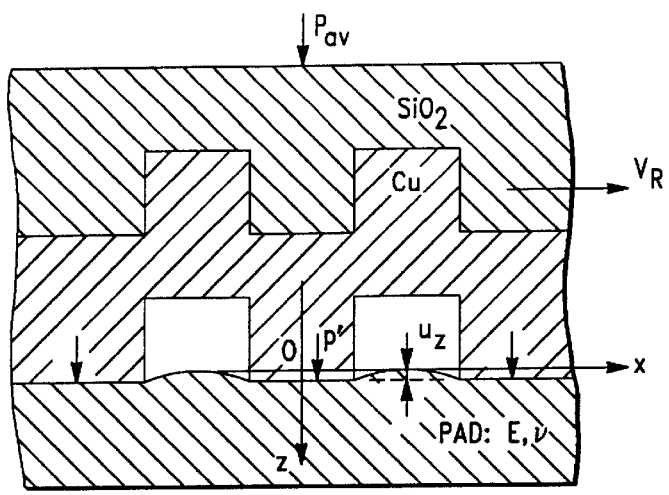
FIG. 2A schematically shows the contact interface between the feature pattern and the polishing pad at the initial stage with uniform pad displacement specified on the high features.
Figure 2B:
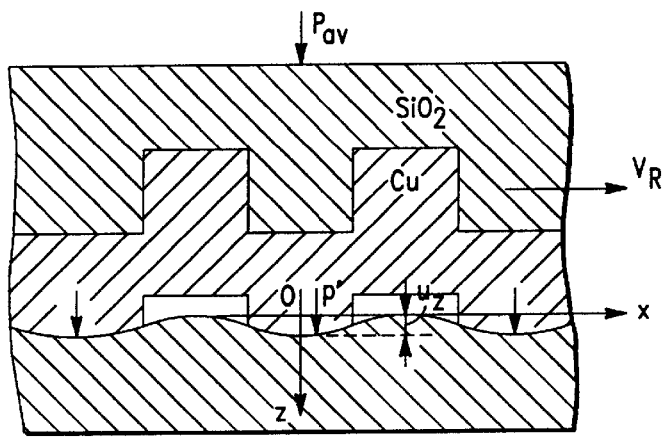
FIG. 2B schematically shows the contact interface between the feature pattern and the polishing pad at the planarization stage with pressure (either uniform pressure or elliptical distribution) specified on the contacting high features.

FIG. 2A schematically shows the contact interface between the feature pattern and the polishing pad at the initial stage with uniform pad displacement specified on the high features. FIG. 2B schematically shows the contact interface between the feature pattern and the polishing pad at the planarization stage with pressure (either uniform pressure or elliptical distribution) specified on the contacting high features.

The local pattern geometry affects the pressure distribution and thus results in a nonuniform material removal according to the Preston equation:

$$\frac{dh}{dt} = k_p p(x, y) v_R \tag{1}$$

Figure 2C:
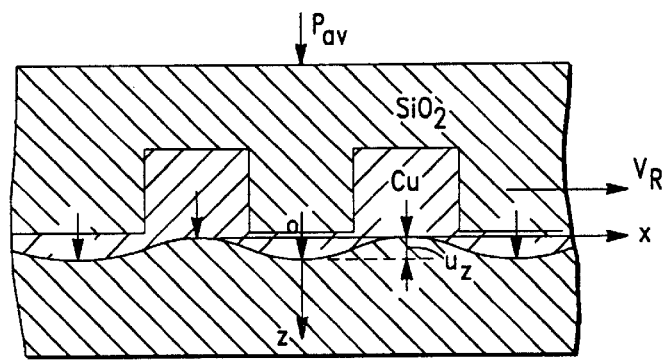
FIG. 2C schematically shows the contact interface between the feature pattern and the polishing pad at the end of planarization with the pad in contact with the low areas.

The objectives of contact mechanics modeling is to determine the pressure distribution on the wafer surface. As schematically shown in FIGS. 2A and 2B, in the step of planarization, the step-height h between high and low features are much larger than the pad displacement $u_z$ and hence the load is essentially supported by the high features only. Then as the pad contacts the low area, both high and low features will be polished. The pressure distribution will become even more uniform while the surface is being gradually polished and smoothed down, as shown in FIG. 2C.

Figure 3:
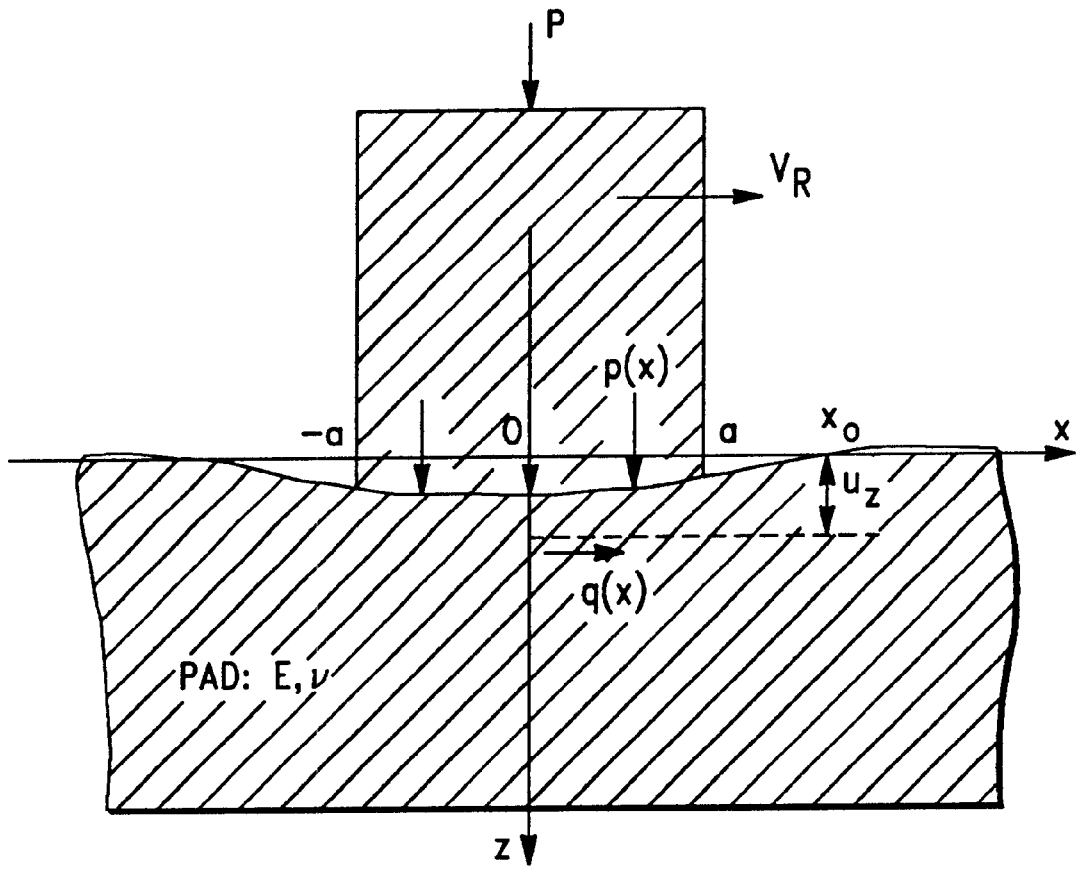
FIG. 3 is a schematic view of a moving rigid line structure in contact with an elastic polishing pad.

FIG. 3 schematically shows a moving rigid line structure in contact with an elastic polishing pad. The high features represent the Cu deposited on the underlying oxide and the low areas represent the Cu filled in the trenched oxide region. Since the length of the line is much larger than its lateral dimensions, the pattern/pad contact can be modeled as a two-dimensional (plane-strain) problem. The pad deformation is usually much smaller than the pad thickness, thus the contact stresses are highly concentrated near the pad surface. With this approximation, the stresses can be calculated by assuming the pad as an elastic semi-infinite body. For simplification, the tangential traction will be assumed to vanish, i.e. q(x)=0, in the following analyses. This assumption stands only when the friction coefficient is low at the interface between the wafer and the pad. Prior experimental results support that the friction coefficient in Cu polishing is about 0.1. Therefore, the effect of tangential traction on the stresses is negligible. Additionally, the pressure outside the loaded regions is zero in step of planarization. In this condition, the entire boundary conditions can be described by specifying either the displacement or pressure distribution in the loaded region ($-a \leq x \leq a$). In some cases, it is simpler to specify the normal displacement $u_z(x)$ within the contact region on the assumption the pad conforms to the profile of high feature. The formulation of the pressure distribution p(x) on the pad surface within the contact region can be expressed as $$\int_{-a}^{a} \frac{p(s)}{x-s} ds = -\frac{\pi E}{2(1-v^2)} \frac{\partial u_z(x)}{\partial x} \tag{2a}$$

and the tangential displacement $u_x(x)$ may be obtained from $$\frac{\partial u_z(x)}{\partial x} = -\frac{(1-2v)(1+v)}{E} p(x) \tag{2b}$$

where $u_z(x)$ is the normal displacement, v the Poisson's ratio, E the Young's modulus of the pad, and s a dummy variable. The general solution of the singular integral Equation (2a) is given by $$p(x) = -\frac{E}{2(1-v^2)(a^2=x^2)^{1/2}} \tag{3}$$

$$\int_{-a}^{a} \frac{(a^2-s^2)^{1/2}}{(x-s)} \frac{\partial u_z(s)}{\partial s} ds + \frac{P}{\pi(a^2-x^2)^{1/2}}$$

where P is the load per unite length on the high features. In the following analyses, these equations will be employed to solve multiple-punch contact conditions with the assumption that superposition is valid.

In the initial stage of Cu planarization, the pattern profile is known from the prior deposition process, as shown in FIG. 2A. By assuming a uniform indentation ($\partial u_z/\partial x=0$) across the flat loaded region, the pressure distribution on the high features ($|x-n\lambda| \leq a$) can be obtained from Equation (3):

$$p(x) = \frac{P}{\pi[a^2-(x-n\lambda)^2]^{1/2}} \tag{4}$$

where P is the load on each contact region, n the index of the high feature from the center of the sub-die area (from $-N$ to N, totally 2N+1 high features). In Equation (4), the load P on each high features is assumed to be constant. This is when the interested features are near the center of a sub-die with repeat pattern, and thus its pressure distribution will not be affected by the different pattern in the neighboring sub-die area.

Figure 4:
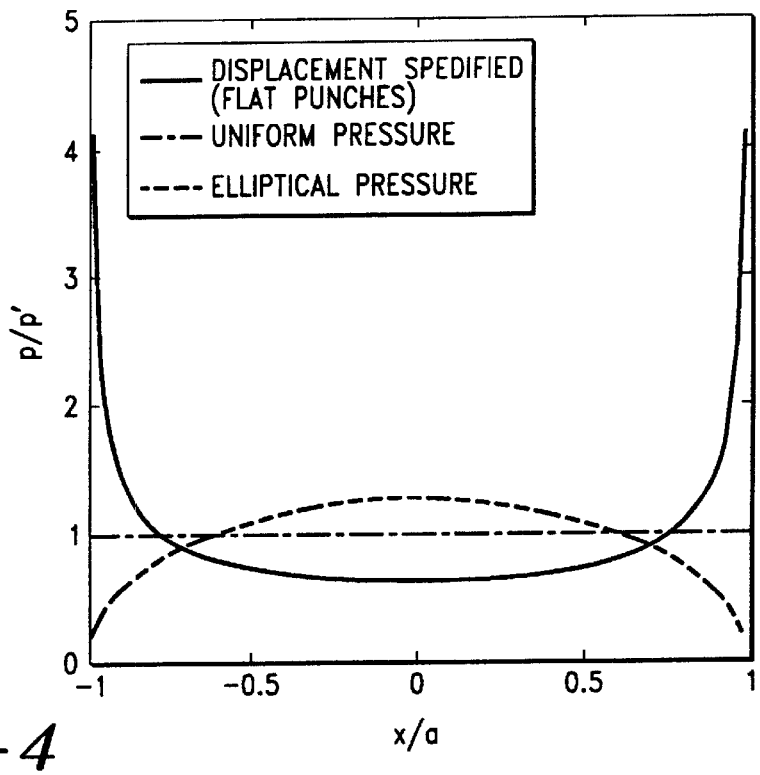
FIG. 4 is a graph illustrating pressure distribution in the contact region of the high feature for various boundary conditions.

FIG. 4 shows the normalized pressure $\bar{p}$ versus the normalized distance x/a across a loaded region (high feature), where the normalized pressure is defined as $$\bar{p}(x) \equiv p(x)/p' \tag{5}$$

where p' is the average pressure on a specific high feature. The pressure reaches a theoretical infinite at the edges in the high features due to the discontinuity of $\partial u_z/\partial x$ at the sharp corners. In reality, a finite radius retains the continuity of $\partial u_z/\partial x$ across the edge and the pressure would increase to a high but finite value near the edge. Moreover, the pad material cannot sustain such a high stress and will plastically yield around the corner of contact. Despite the pressure concentration near the edges, the pressure is distributed uniformly over the feature and close to about 0.7 time of the average pressure p' in the contact region. Additionally, Equation (4) shows that the general shape of the curve is not affected by the load and the elastic properties of the pad. Increase of the load on each high feature will proportionally increase the pressure at each point but not change its distribution over the high feature.

The pad displacement outside the high features can be found by substituting the pressure within loaded regions obtained from Equation (4) into equation (2a) and performing the integration. The pad displacement can be expressed in the normalized form as $$\bar{u}_z = -\frac{4(1-v^2)p'}{\pi E} \sum_{n=-N}^{N} \ln\left[\frac{x-n\lambda}{a} + \left(\left(\frac{x-n\lambda}{a}\right)^2 - 1\right)^{1/2}\right] + (2N+1)C_1 \tag{6}$$

where $\bar{u}_z$ is the normalized displacement outside the high features, defined as $\bar{u}_z(x) \equiv u_z(x)/a$, and $C_1$ is the normalized integration constant, defined in the case of single flat punch indentation and can be written as $$C_1 = \frac{2(1-v^2)p'}{\pi E} \ln\left[\frac{x_0}{a} + \left(\frac{x_0^2}{a^2} - 1\right)^{1/2}\right] \tag{7}$$

The integration constant $C_1$ can only be determined by choosing a datum $x_0$ on displaced surface referred to the initial surface plane, in which $u_x(x_0)=0$. The choice of $x_0$ usually needs to refer to the observation on the real deformed surface. This difficulty of determining $C_1$ is a general feature of the elastic half-space problem since the boundary conditions at the far ends away from the contacting surface are undefined. To surmount the difficulty, the actual shape and dimension of the elastic body and the boundary conditions at the supporting sides must be considered. However, if the interest is on the relative shape of the pad surface and its displacement into low features instead of the movement of its surface level, the choice of $x_0$ is not important and will not affect the profile of the pad surface.

The boundary condition of uniform pressure may be applied when a steady-state profile of high features is reached with the assumption that there is no contact on the low features, as shown in FIG. 2B. The pressure distribution can be related to the load P on each high feature ($|x-n\lambda| \leq a$ and the half width a of the feature as:

$$p(x) = \frac{P}{2a} = p' \qquad (8)$$

Utilizing this boundary condition, Equation (2a) can be solved for the pad displacement over the sub-die area. Similarly, the displacement can be written in normalized form as $$\bar{u}_z = -\frac{(1-v^2)p'}{\pi E} \sum_{n=-N}^{N} \left[ \left(1 + \frac{x-n\lambda}{a}\right) \ln\left(1 - \frac{x-n\lambda}{a}\right)^2 + \left(1 - \frac{x-n\lambda}{a}\right) \ln\left(1 - \frac{x-n\lambda}{a}\right)^2 \right] + (2N+1)C_2 \qquad (9)$$

where $C_2$ is an integration constant and determined relative to a datum $x_0$.

$$C_s = \frac{(1-v^2)p'}{\pi E} \left[ \left(1 + \frac{x_0}{a}\right) \ln\left(1 + \frac{x_0}{a}\right)^2 \left(1 - \frac{x_0}{a}\right) \ln\left(1 - \frac{x_0}{a}\right)^2 \right] \qquad (10)$$

Another possible boundary condition on the high feature is elliptical pressure distribution given by Hertz theory. In this case, both the wafer and the pad are modeled as non-conforming, elastic bodies. Consider a two-dimensional Hertzian contact problem, the pressure distribution in the contact region, $|x-n\lambda| \leq a$, can be expressed as:

$$p(x) = p_0 \left(1 - \left(\frac{x}{a}\right)^2\right)^{1/2} \qquad (11)$$

where $p_o$ is maximum pressure on the feature and can be found by $$p_0 = \frac{2P}{\pi a} = \frac{4p'}{\pi} \qquad (12)$$

As also shown in FIG. 4, the pressure distribution can be rewritten as the normalized form, $\bar{p}$, versus the dimensionless distance $x/a$.

$$\bar{p}(x) = \frac{4}{\pi}\left(1 - \left(\frac{x}{a}\right)^2\right)^{1/2} \qquad (13)$$

The elliptical pressure distribution should result in a higher rate of material removal near the center of high features. This will change the profile of the high features and promote the pressure distribution toward a more uniform fashion. Applying this elliptical pressure distribution on the boundary, the normalized displacement is given as $$\bar{u}_z = -\frac{4(1-v^2)p'}{\pi E} \sum_{n=-N}^{N} \left\{ \left(\frac{x-n\lambda}{a}\right)^2 - \left[ \frac{|x-n\lambda|}{a} \sqrt{\left(\frac{x-n\lambda}{a}\right)^2 - 1} - \ln\left(\frac{|x-n\lambda|}{a} + \sqrt{\left(\frac{x-n\lambda}{a}\right)^2 - 1}\right) \right] \right\} + (2N+1)C_3 \qquad (14)$$

where $C_3$ is another dimensionless integration constant.

$$C_3 = \frac{4(1-v^2)p'}{\pi E} \left\{ \left(\frac{x_0}{a}\right)^2 - \left[ \frac{|x_0|}{a} \sqrt{\left(\frac{x_0}{a}\right)^2 - 1} - \ln\left(\frac{|x_0|}{a} + \sqrt{\left(\frac{x_0}{a}\right)^2 - 1}\right) \right] \right\} \qquad (15)$$

Figure 5:
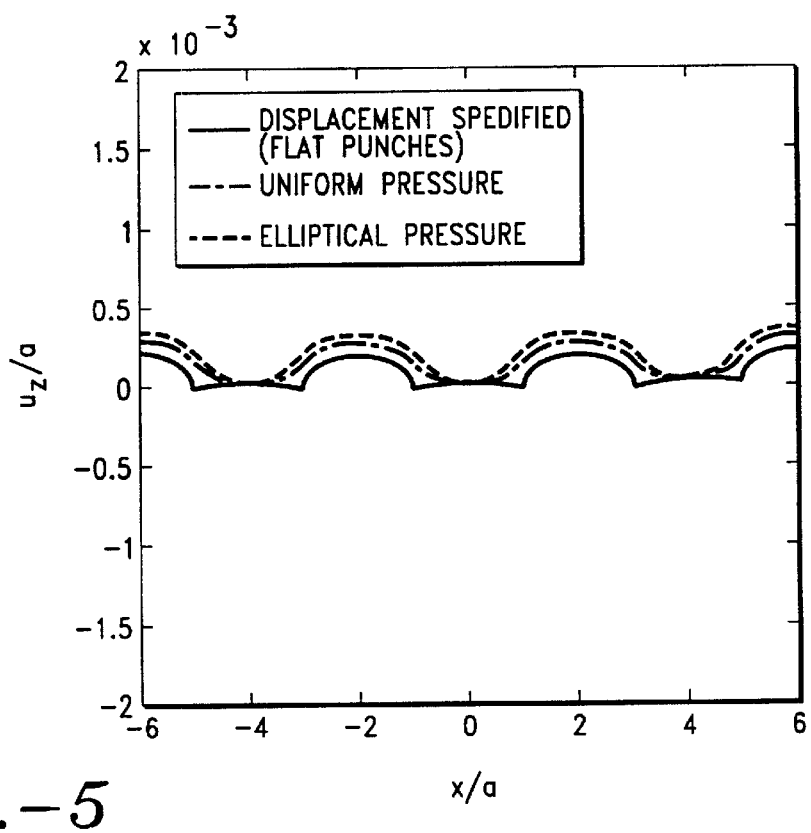
FIG. 5 is a schematic view showing the surface profile of the deformed pad for various boundary conditions.

FIG. 5 is a schematic view showing the surface profile of deformed pad for various boundary conditions The normalized pad displacements near the center of the sub-die region for the various boundary conditions are based on Equations (6), (9), and (14). The zero on the ordinate is set to refer to the top of the high features. The displacement is calculated based on the geometry close to current CMP practice that area fraction is 0.5 ($A_f$=w/$\lambda$=1−2a/$\lambda$=0.5), and the applied pressure on the wafer is 0.05 MPa (7 psi).

As shown in Table 1, the elastic modulus and Poisson's ratio of the pad are assumed to be E=500 MPa and v=0.3 (close to those of the current pad). The assumption of rigid punching indentation in prior analyses is valid since the Young's moduli of all materials involved in Cu damascene are much higher than that of the pad.

TABLE 1

Elastic Properties of Materials.

| Material | Young's Modulus (GPa) | Poisson's Ratio |
|---|---|---|
| Cu | 128[†] | 0.30 |
| Ta | 186[†] | 0.30 |
| SiO$_2$ (TEOS) | 74[††] | 0.20 |
| Rodel Pad | 0.5 | 0.30 |

[†]ASM Metals Handbook, ASM International.
[††]Handbook of Materials Science, CRC Press Inc.

It is shown that the maximum displacements of the pad for three boundary conditions are approximately of the same order of magnitude. For current circuit design in which the width of small features is about w=0.18–0.5 μm (or a=0.09–0.25 for features with area fraction of 0.5), the displacement of the pad outside the high features is about 0.03 to 0.08 nm, almost negligible compared with the surface roughness of the pad. Therefore, if the step-height is much larger than the pad displacement, such as in planarization stage of Cu polishing (for an initial step-height of about 0.5–1 μm), the pad is expected to be not in contact with the low surfaces. Thus material removal rate on low features will be relatively low because no abrasion would occur until the end of the planarization process. Additionally, FIG. 5 is calculated based on the indentation of 33 flat punches (high features). It is found that the pad displacement near the center of the sub-die area is almost not affected by the total number and geometry of features beyond a certain distance from the point of interest. In general, the displacement of the pad and the shape of the deformed pad at a specific low feature will be only affected by the features within five or six times of the pitch from the region interested.

The effects of linewidth on pad displacement can also be illustrated in FIG. 5. For a pattern with constant area faction, for example 0.5, the increase of linewidth will proportionally scale up the displacement of the pad. Consequently, the pad might start to contact the low area before the topography is planarized and the rate of planarization decreases. For instance, the pad displacement is about 20 nm for 100 μm wide line. In practice, when the size of pad asperities which is about 100–200 nm, and particle size which is about 200 nm are considered, the low area of a wide feature (interconnect line, contacting pad) will be in contact with the pad at the earlier planarization regime (about half of the initial step-height in this case). Comparatively, for sub-micron size features, the pad asperities cannot reach the low feature freely with the constraint of the surrounding high features. Hence, the pad does not contact the low area until the end of the planarization regime because the pad displacement is very small.

Another effect of increased linewidth with the same area fraction $A_f$ is to decrease the average material removal rate on the high feature. Since part of the load at some point in planarization regime is supported by the low features, the average pressure on the high feature decreases and so does material removal rate. The variation of the material removal rate on different area fraction regions results in a variation of process duration for clearing Cu on the same die. This will require part of the die to be overpolished and introduces oxide thickness variation and Cu loss problems. Additionally, the earlier the low features are in contact with the pad, the more likely the surface topography may partially remain until the end-point of the process. This may increase the surface nonuniformity and start dishing the Cu in the trenches before the Cu layer is polished through.

Figure 6:
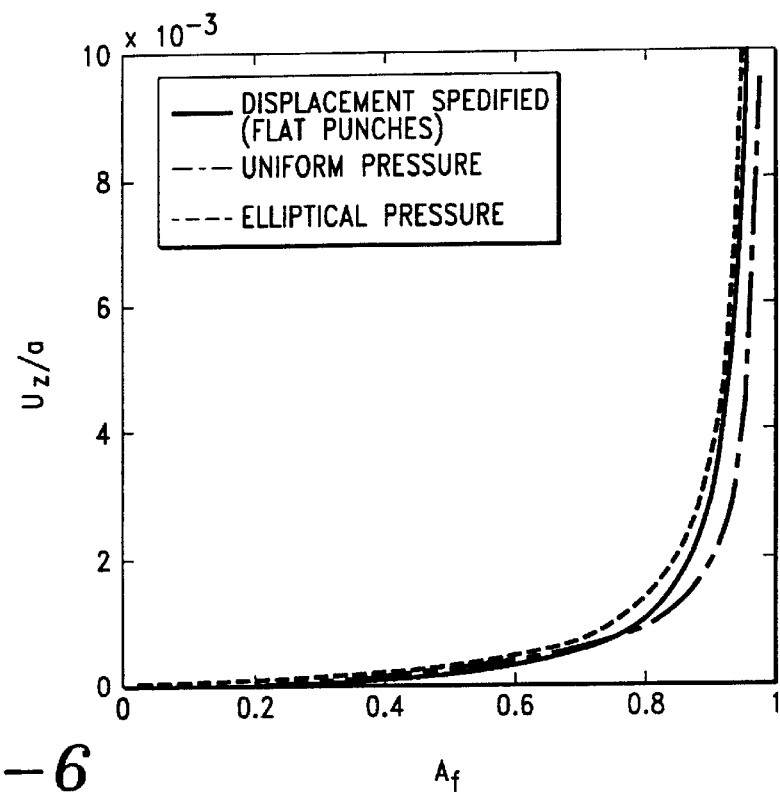
FIG. 6 is a graph illustrating the pad displacement versus the pattern area fraction for various boundary conditions.

FIG. 6 illustrates the pad displacement versus the pattern area fraction for various boundary conditions. The normalized pad displacement, $u_z/a$, increases with the $A_f$. The three boundary conditions applied show the same trends and similar value of displacement. Among these three boundaries, the elliptical pressure distribution gains the largest pad displacement for all $A_f$. For lower $A_f$, the boundary condition of uniform pressure results in a slightly larger pad displacement at the low area than that of the constant displacement specified condition. When $A_f$ is greater than 0.7 approximately, the pad displaces more at the low area with the boundary condition of constant displacement at the loaded region.

Except at the steep increase of $u_z/a$ with $A_f$ at higher area fraction region, i.e. greater than 0.7, the displacement increases almost linearly with $A_f$. Between area fraction of 0.2 to 0.6, the slope of the curve is about $1\times10^{-3}$. Thus the pad displacement will be at the same order of magnitude even with a slight variation of area fraction for the present circuit design practices. Therefore, for the first few metal layers with fine interconnects, the surface will be planarized down before the pad in contact with the low area. Besides, if the Cu linewidth is small and the effect of pad displacement is essentially negligible, the material removal rate and the rate of planarization will both increase proportionally with $A_f$ because the average pressure on the high features is inversely proportional to $A_f$. This will result in buildup of the surface non-planarity within the die across different area fraction regions at the planarization stage of process.

Figure 7:
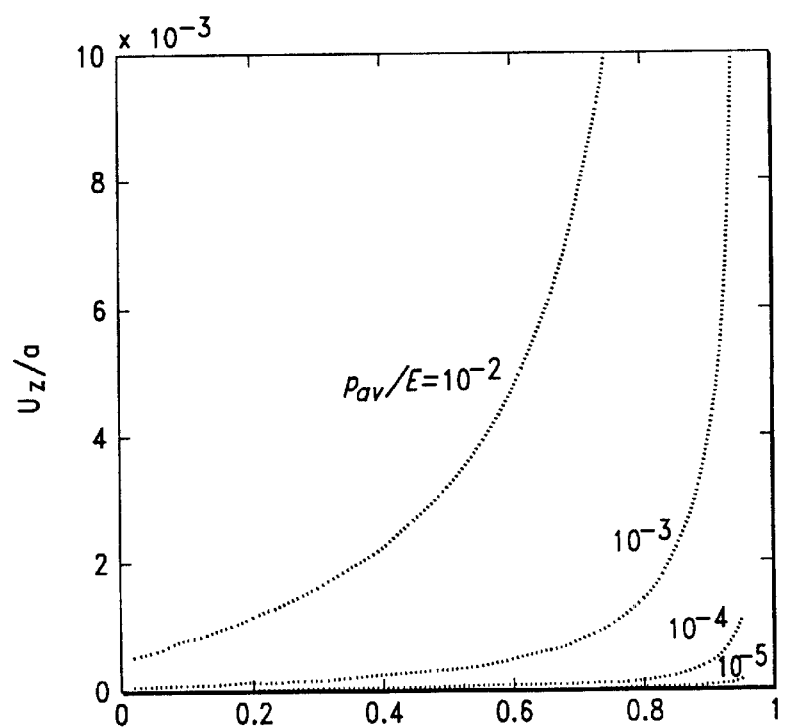
FIG. 7 is a graph illustrating the effect of applied pressure $P_{av}$ and Young's modulus of the pad E on the pad displacement (elliptical pressure distribution).

FIG. 7 illustrates the effect of applied pressure $P_{av}$ and Young's modulus of the pad E on the pad displacement (elliptical pressure distribution), with a dimensionless parameter $p_{av}/E$, which is close to $10^{-4}$ for the present pad and nominal pressure employed in CMP. However, different pads may be used to vary the degree of surface planarity. For examples, some engineering plastics, with E about one order of magnitude greater than the polyurethane pad (about 1–5 GPa), or even some soft metals with two orders of magnitude greater than E (about 10–20 GPa), may be used as the top pad to improve the surface planarity. FIG. 7 indicates that the pad displacement will decrease proportionally with the increase of E or the decrease of $p_{av}/E$ value. The results can be applied to the pad displacement at both the low feature and the lower sub-die region which has been polished down faster due to higher area fraction than the surrounding low area fraction surface. By using a stiffer pad, the surface level of two distinct area fraction regions may be maintained at small difference and retain the surface planarity across the die. On the other hand, a compliant pad, such as some polymer foams with E ranging from about 500 MPa to about 10 MPa, to reduce the load on abrasive particles and prevent surface scratching in the final polishing regime. By employing the contact mechanics models, the desired range pad properties with respect to the range of applied pressure can be determined.

Figure 2D:
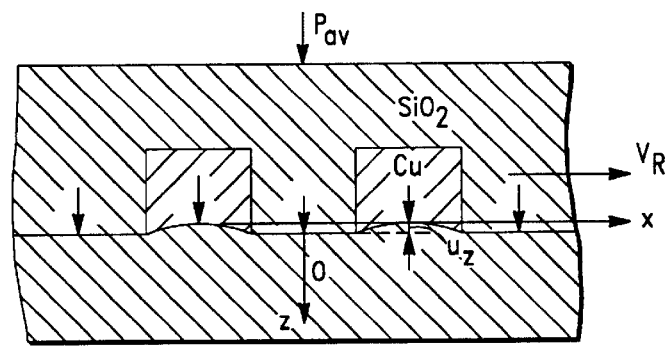
FIG. 2D schematically shows the contact interface between the feature pattern and the polishing pad at the onset of dishing and overpolishing.

Returning to FIG. 2D which illustrates the contact interface between the feature pattern and the polishing pad at the onset of dishing and overpolishing. As shown in FIG. 2D, the soft Cu interconnects wear faster than the diffusion barrier (Ta, Ti or TaN) and the inter-level dielectric (ILD) oxide, and the surface of Cu interconnects is dished. Additionally, in order to isolate the Cu interconnects on the pattern, the oxide will be overpolished.

In accordance with the CMP method of the present invention, a second step of polishing the insulation layer and the lower portion of the metal layer is carried out in a steady-state mode to form individual metal lines in the trenches with minimal dishing of the metal lines and minimal overpolishing of the insulation layer.

Referring to the wear equation, the Preston constant can be defined as the ratio of the wear coefficient $k_w$ to the hardness H of material being polished. Thus the intrinsic material removal rate at any point on the wafer surface can be determined by the Preston equation, which may be rewritten as $$\frac{dh}{dt} = \frac{k_w}{H} p v_R \qquad (16)$$

where p is the local average pressure applied at the vicinity of the interested point on the wafer surface. The wear coefficient depends on the polishing mechanism and is insensitive to the material polished. $K_w$ approximately remains a constant for various surface coatings including Cu and TEOS on blanket wafers in the CMP conditions. If the $k_w$ is assumed the same on both die- and feature-scales, then the material removal rate on both Cu and oxide surface, as shown in FIG. 2D, may be expressed as $$\left(\frac{dh}{dt}\right)_{Cu} = \frac{k_w}{H_{Cu}} p_{Cu} v_R \qquad (17)$$

$$\left(\frac{dh}{dt}\right)_{Oxide} = \frac{k_w}{H_{Cu}} p_{Oxide} v_R \qquad (18)$$

where $H_{Cu}$ and $H_{Oxide}$ are the material hardnesses of Cu and oxide, respectively. If the steady-state regime is assumed, i.e. the amount of Cu dishing remains constant with overpolishing time, the material removal on both Cu and oxide surface should be uniform and at the same rate.

$$\left(\frac{dh}{dt}\right)_{Cu} = \left(\frac{dh}{dt}\right)_{Oxide} \qquad (19)$$

By equating Equations (17) and (18), and noticing that the relative velocity on the adjacent Cu and oxide regions are virtually the same, the relation between pressure distributed on and Cu and oxide and the hardness of these materials can be expressed as:

$$\frac{p_{Cu}}{p_{Oxide}} = \frac{H_{Cu}}{H_{Oxide}} \quad (20)$$

To solve $p_{cu}$ and $p_{Oxide}$ with pattern geometry, the force equilibrium condition on the interested area across an interconnect and the surrounding oxide spacing can be employed.

$$p_{Cu}{}^w + p_{Oxide}(\lambda - w) = \bar{p}\lambda \quad (21)$$

where $\bar{p}$ is the average pressure on the specific area. In terms of area fraction, $A_f = w/\lambda$, Equation (21) can be rewritten as $$p_{cu}A_f + p_{Oxide}(1-A_f) = \bar{p} \approx p_{av} \quad (22)$$

Since the surface variation (nonuniformity) will not be large, usually less than 100–200 nm after a short period of overpolishing, the local average pressure on $\bar{p}$ can be assumed approximately equal to the average pressure on the die $p_{av}$. Solving Equation (22) by the relation given in Equation (20), the pressure on the oxide surface in steady-state is given as $$p_{Oxide} = \frac{\bar{p}}{[(H_{Cu}/H_{Oxide})A_f + (1-A_f)]} \approx \quad (23)$$

$$\frac{p_{av}}{[(H_{Cu}/H_{Oxide})A_f + (1-A_f)]}$$

The pressure on the oxide surface is a function of average pressure on the die, the hardness of the materials presented on the surface, and the area fraction of the pattern. If the pressure in Equation (18) is replaced by Equation (23), the Preston equation on the oxide surface can be rewritten as $$\left(\frac{dh}{dt}\right)_{Oxide} = \frac{k_w}{H_{Oxide}} \frac{\bar{p}}{[(H_{Cu}/H_{Oxide})A_f + (1-A_f)]} v_R = \quad (24)$$

$$\frac{k_w}{H'} \bar{p} v_R \approx \frac{k_w}{H'} p_{av} v_R$$

where H' is defined as the "apparent hardness" and can be written as $$H' \equiv H_{Cu}A_f + H_{Oxide}(1-A_f) \quad (25)$$

Equation (24) can be interpreted as that, in steady state, the polishing rate on a specific patterned area is equivalent to the rate in field area with material hardness H' and the same average pressure $\bar{p}(\approx p_{av})$. If there is a variation of H' across a die area due to the variation of pattern area fraction, the deviation of the oxide and Cu thickness from the mean thickness will increase with overpolishing time. Hence the apparent hardness across the die should be designed as uniform as possible to reduce overpolishing. Additionally, the rate of oxide overpolishing is bounded by the steady-state rate and the blanket oxide polishing rate. Based on force equilibrium, the pressure on the oxide will increase with the increase of dishing (less pressure will be applied on the Cu lines) until a steady-state value is reached. Similarly, the Cu polishing rate is bounded by the blanket Cu rate (as on the planar surface right at the end-point) and the steady-state rate of the surrounding oxide (which is very close to blanket oxide polishing rate except in the case of extreme high area fraction).

Experimental

The following examples are provided to illustrate the CMP method, and not intended to limit the scope of the present invention in any way.

Figure 8:
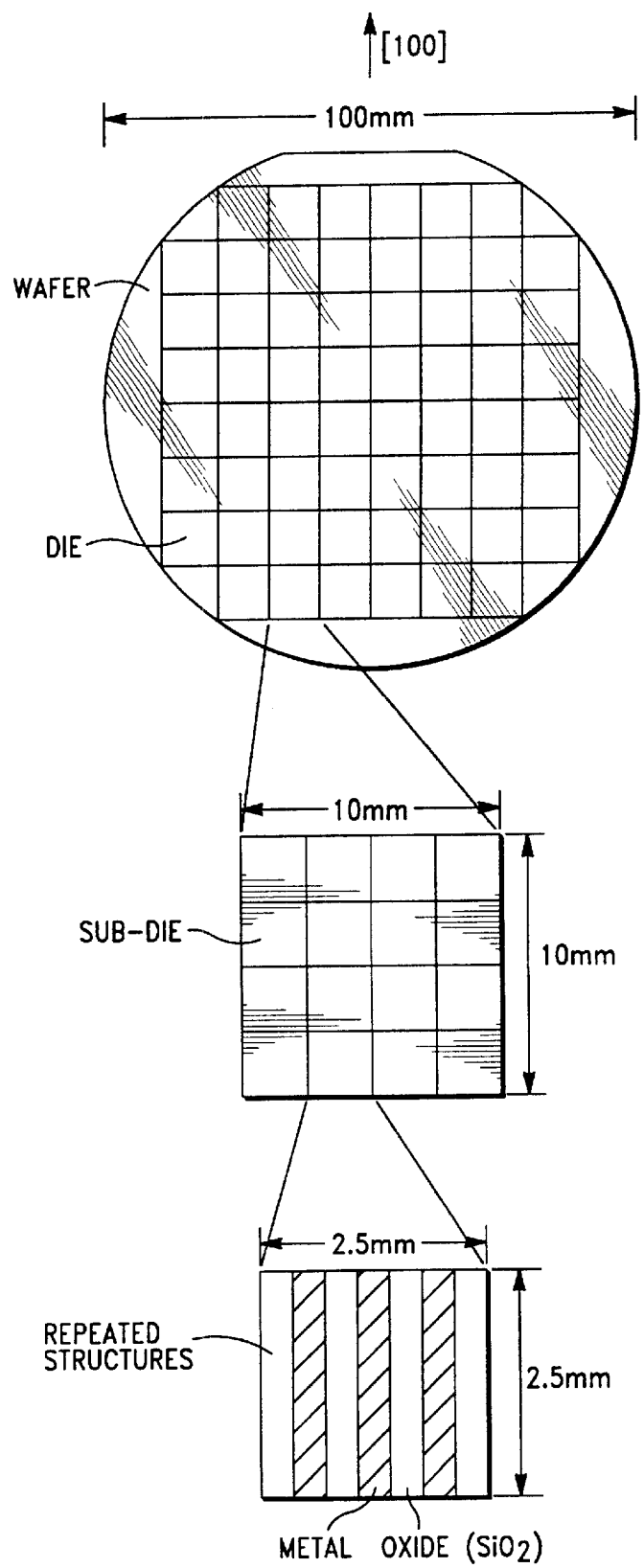
FIG. 8 schematically shows the pattern layout on a test wafer.

A Cu damascene structure was designed to study the effects of geometry on metal dishing and oxide overpolishing. FIG. 8 schematically shows the pattern layout on a test wafer. The pattern on each die (10 mm×10 mm) consists of a matrix of 2 mm×2 mm blocks (sub-die area). These blocks in turn consist of line-space features, with a minimum linewidth of 0.5 $\mu$m.

Figures 9A, 9B:
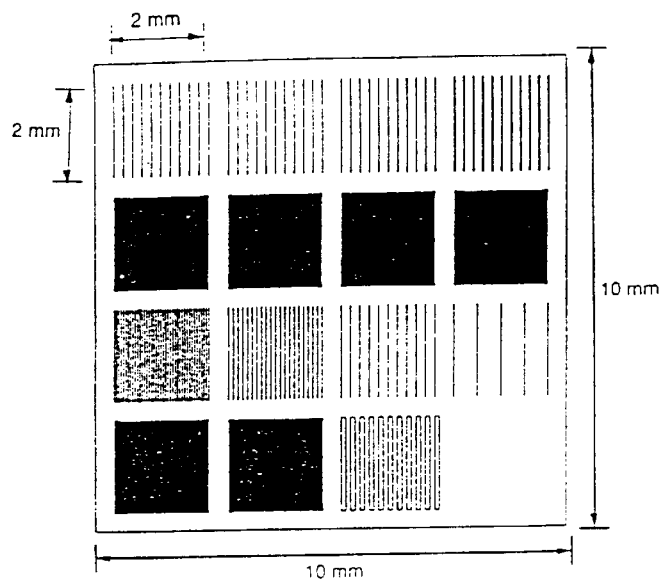
FIG. 9A schematically shows a CMP mask layout.
FIG. 9B illustrates the pattern geometry layout corresponding to the CMP mask layout as illustrated in FIG. 9A.

FIG. 9A schematically shows a CMP mask layout. FIG. 9B illustrates the pattern geometry layout corresponding to the CMP mask layout as illustrated in FIG. 9A. As shown in FIGS. 9A–9B, the first type of features are composed of fine Cu lines of constant linewidth 0.5 $\mu$m and various pitch ranging from 1 $\mu$m to 200 $\mu$m. These represent the metal interconnects with critical dimension and different packing density. The second type of features includes various Cu lines from 0.5 $\mu$m to 100 $\mu$m with large pitch 200 $\mu$m providing large spacing between adjacent Cu interconnects to study the effect of linewidth on dishing. For small Cu lines, the wide spacing helps reduce the effect of $SiO_2$ overpolishing on dishing. The third type of features includes two constant Cu area fractions 0.01 and 0.5 with various linewidths and pitches designed to study the effects of scaling on dishing and overpolishing. The 0.5 area fraction is close to the present design rules of metal layer layout in ULSI circuits. By contrast, the features with 0.01 area fraction represent single, isolated lines. Table 2 lists the design features of the various patterns described above.

TABLE 2

Linewidth ($\omega$), Pitch ($\lambda$) and Area Fraction ($A_f$) of Patterns on the Test Mask.

| $\omega$ ($\mu$m) | $\lambda$ ($\mu$m) 1 | 2 | 4 | 10 | 50 | 100 | 200 | 500 |
|---|---|---|---|---|---|---|---|---|
| 0.5 | 0.50 | 0.25 | 0.125 | 0.05 | 0.01 | | 0.0025 | |
| 0.7 | | | | | | | 0.0035 | |
| 1.0 | | | | | | 0.01 | | |
| 2.0 | | | 0.50 | | | | 0.01 | |
| 5.0 | | | | | | | 0.025 | 0.01 |
| 25 | | | | | 9.59 | | 0.125 | |
| 100 | | | | | | | 0.50 | |

Figure 10:
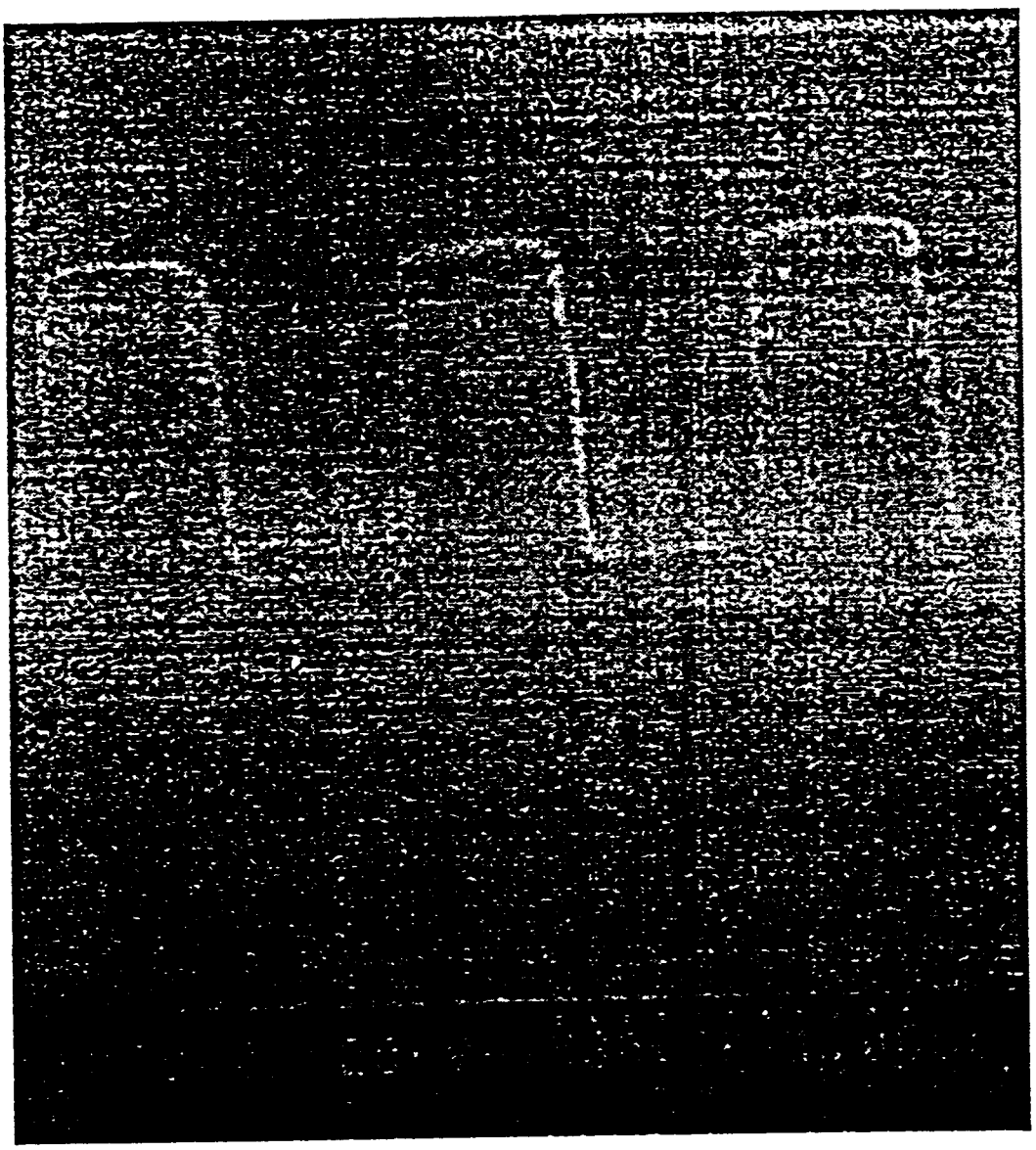
FIG. 10 is a SEM showing the cross section of a feature pattern.

The pattern was transferred onto an 1.5 $\mu$m thick $SiO_2$ (TEOS) coating by lithography on an 100 mm, (100) orientation silicon wafer. After oxide trenches were etched to a depth of 1 $\mu$m, a Ta barrier layer of 20 nm thickness was deposited, followed by a PVD Cu film of 1.5 $\mu$m thickness. FIG. 10 is a Scanning Electron Micrograph (SEM) of the cross-section of the patterned wafer.

The experiments were conducted on a rotary-type polisher. The normal pressure and relative velocity were maintained at 48 kPa and 0.7 m/s, respectively, to ensure the wafer/pad interface in contact. The polishing duration was varied from 1 minute to 6 minutes to cover the under-polished, just-polished, and overpolished periods. The polishing slurry was composed of 4 vol. % of $\alpha$-$Al_2O_3$ abrasives with average size 300 nm. In contrast to the acidic solutions used in commercial Cu CMP, the slurry pH was maintained at 7 to focus only on the mechanical aspects of polishing. The Rodel IC-1400 was used to polish the wafer and the pad was conditioned before polishing each wafer. The experimental conditions of the polisher are listed in Table 3.

TABLE 3

Experimental Conditions

| Experimental Parameters | Experimental Conditions |
|---|---|
| Diameter of Wafer (mm) | 100 |
| Normal Load (N) | 391 |
| Normal Pressure (kPa) | 48 |
| Rotational Speed (rpm) | 75 |
| Linear Velocity (m/s) | 0.70 |
| Duration (min) | 1–6 |
| Sliding Distance (m) | 42–252 |
| Slurry Flow Rate (ml/min) | 150 |
| Abrasive | $\alpha\text{-}Al_2O_3$ |
| Abrasive Size (nm) | 300 |
| pH | 7 |

The profiles of the pattern surface at different polishing times were measured by stylus profilometry and by Atomic Force Microscope (AFM) for coarse and fine features. From this data, the Cu dishing was determined by measuring the amount of recess on the Cu lines relative to the oxide surface after the Cu coating on the oxide was cleared. The oxide overpolishing was determined by measuring the remaining oxide thickness. For coarse features, the oxide thickness was measured directly by ellipsometry. For fine features which were less than 20 μm wide, a reference oxide thickness was measured by ellipsometry on the 400 μm wide oxide spacing between sub-die blocks. The thickness of the oxide features was determined by relating the surface profile inside the sub-die block to these reference spacing. All the measurements were carried out at the center of the sub-die block of the center die to minimize the effects of spatial variations due to wafer-scale polishing non-uniformity.

Figure 11A:
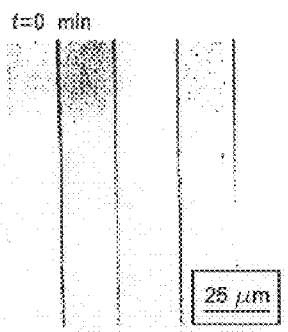
FIGS. 11A–11F are optical micrographs illustrating the evolution of the pattern surfaces (w=25 μm and λ=25 μm) with time in the CMP.
Figure 11B:
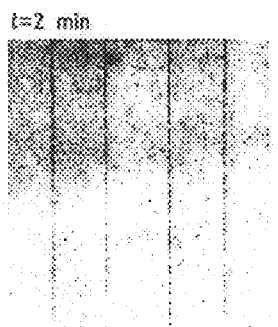
Figure 11C:
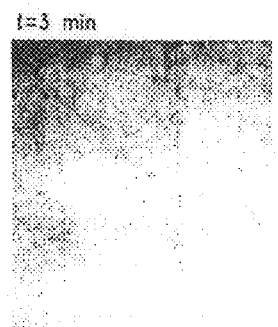
Figure 11D:
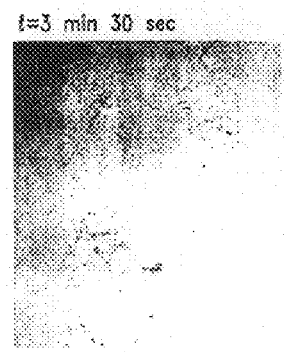
Figure 11E:
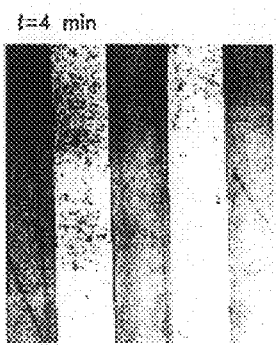
Figure 11F:
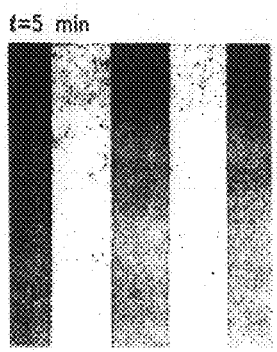

FIGS. 11A–11F are optical micrographs illustrating the evolution of the pattern surfaces (w=25 μm and λ=25 μm) with polishing time. FIG. 11A illustrates the unpolished, scratch-free high features that are bright in the optical micrograph due to the high reflectance of Cu. The walls between the high and low surfaces appear dark in the bright-field illumination since less normal incident light is reflected. FIG. 11B shows that after two minutes of polishing, the surface of high features is roughened. However, the surface of the low area still remains the same microstructure from the Cu deposition, which indicates that the pad does not contact the low area. FIG. 11C shows that after three minutes of polishing, the surfaces of both high and low features are roughened and the boundaries between the high and low features become less distinguishable. This is because the step-height decreases and the sharp edges of high and low features are rounded. Therefore, the pad is in contact with both the high and low features and both surfaces are polished. FIG. 11D shows that after three minutes and 30 seconds, the boundaries become indistinguishable, the step-height almost vanishes and the Cu surface is planarized. FIG. 11D shows that when the process almost hits the end-point at three minutes and 30 seconds, the less reflective barrier layer Ta starts to appear. FIG. 11E shows that after thirty more seconds of polishing, the barrier layer is cleared and the underlying oxide exposed. FIG. 11F shows a much darker oxide surface after five minutes, indicating that the Ta layer is polished off. The Cu lines are distinct because the reflectance of oxide is much less than that of Cu.

Figure 12:
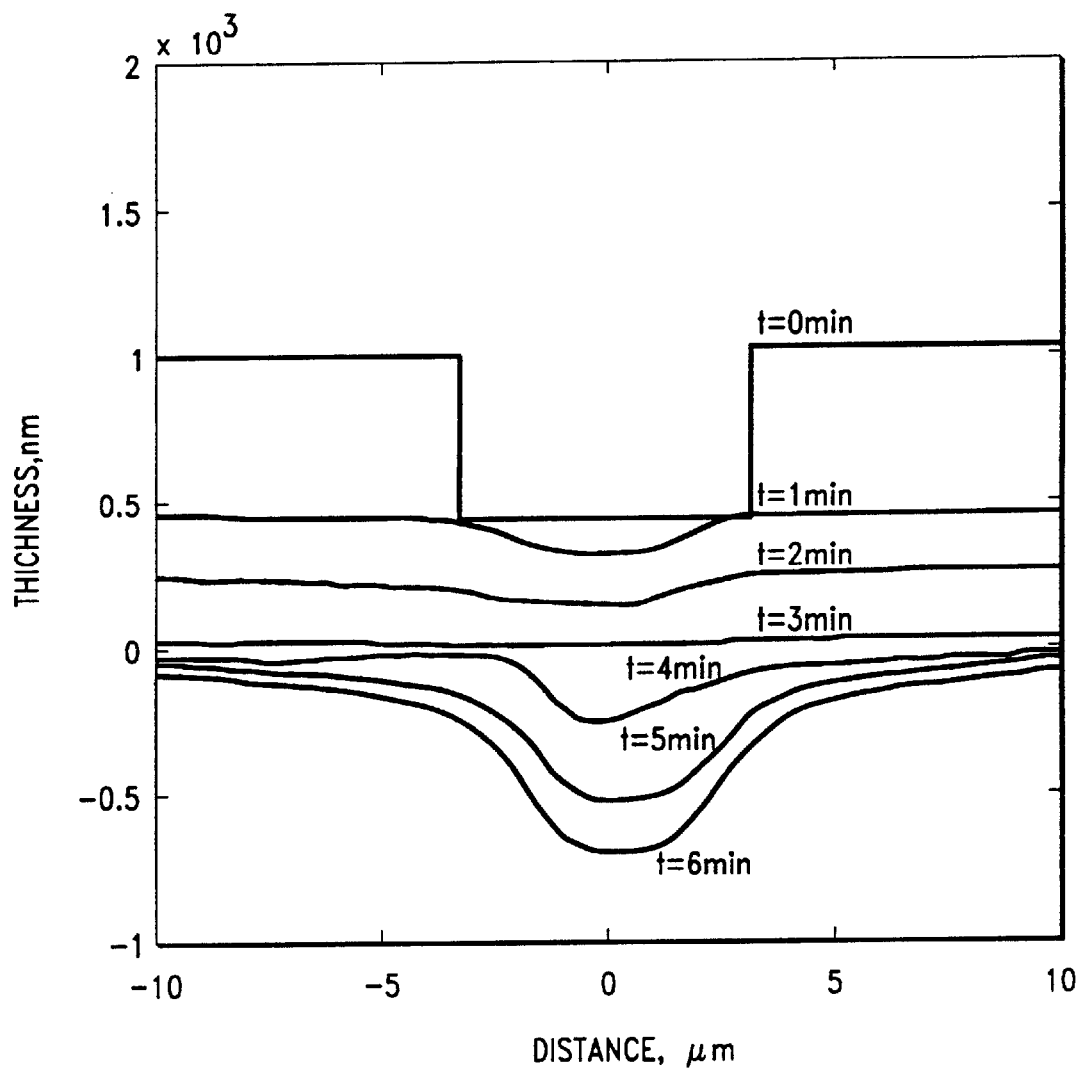
FIG. 12 are graphs illustrating cross-sectional profiles of the pattern during the evolution with time (w=5 μm and λ=200 μm).

FIG. 12 is a graph illustrating cross-sectional profiles of the pattern during the evolution with time (5 μm linewidth and 200 μm pitch). At the beginning of polishing, the high features were removed faster than the low features, which quickly smoothed the surface. Also, the sharp corners were rounded in this period because of the pressure concentration at the edge. The material removal rate in the planarization stage was about 500 nm/min for this feature and about twice the blanket rate although 0.025 area fraction of the high features was very close to blanket surface. One explanation for this was that the trenches on the surface improved the local slurry dispensing. Moreover, the pressure on each sub-die might not be uniform due to the die-level surface nonuniformity.

As the step-height between the high and low features decreases, the material removal rate on the high features approached that of the low features. This indicates that the pressure distributed much more uniformly while the surface was smoothed out. Finally, both material removal rates were close to the blanket Cu polishing rate which was about 220 nm/min, and the surface was planarized. Then the Cu surface remained flat until the process end-point reached, which was consistent as shown in FIG. 11C. After passing the end-point, which was between 3 and 4 minutes, the Cu lines started dishing and the amount of dishing increased with overpolishing time. The oxide was polished too, but at a rate much slower than that of soft Cu. Therefore, the surface topography built up again.

Figures 13C, 13D:
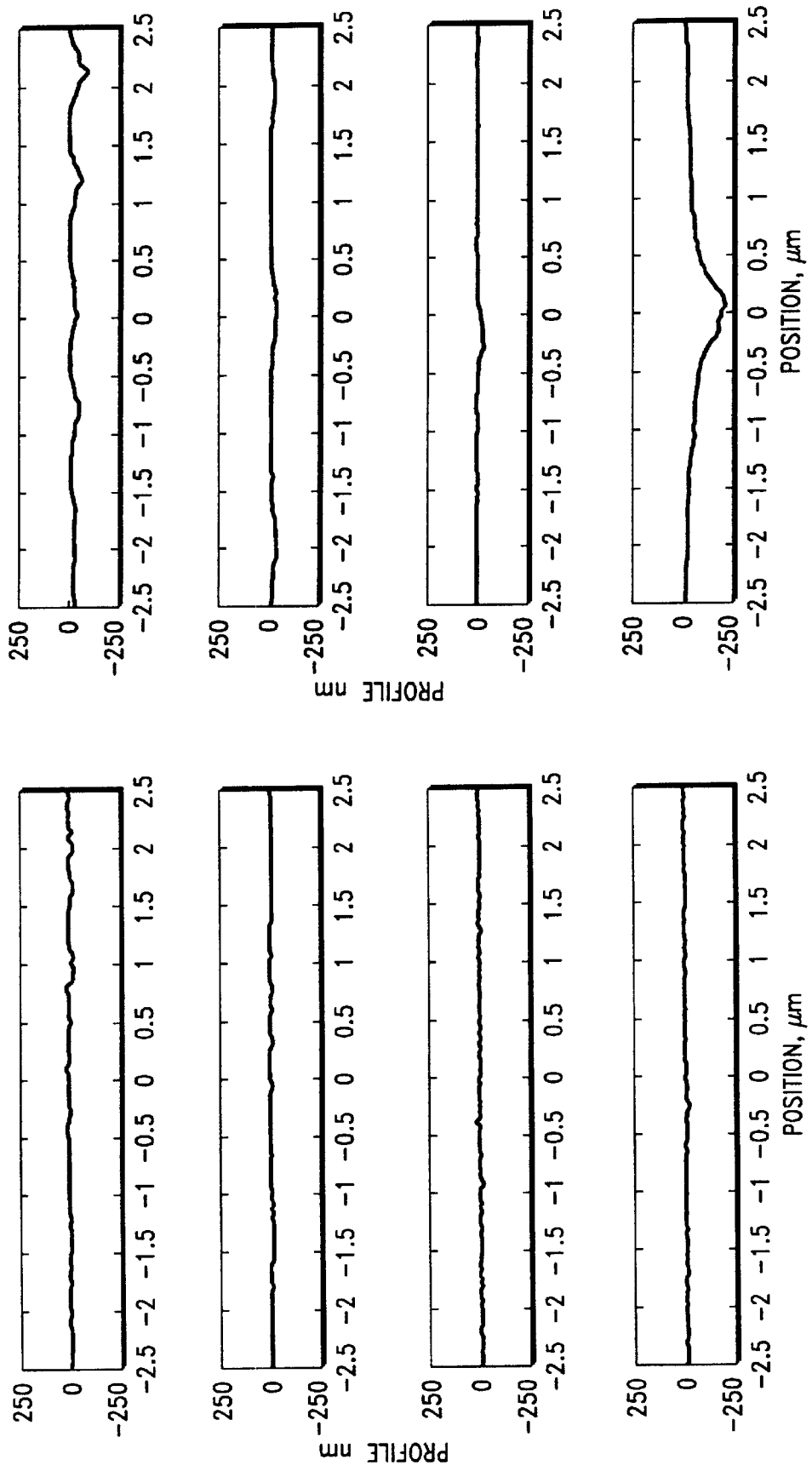
FIG. 13C are graphs illustrating the surface profiles of various patterns after CMP at 3 minutes and 30 seconds.
FIG. 13D are graphs illustrating the surface profiles of various patterns after CMP at 5 minutes.

FIGS. 13A–13D shows a similar trend of pattern evolution on the smallest features, i.e. 0.5 μm Cu lines. FIG. 13A are AFMs showing various patterns with 0.5 μm linewidth and different pitches (1, 2, 4 and 200 μm) after CMP for 3 minutes 30 seconds which is about the process end-point. FIG. 13B are AFMs after CMP for 5 minutes. FIGS. 13C–13D are graphs illustrating the surface profiles of various patterns after CMP for 3 minutes 30 seconds and for 5 minutes respectively. All surfaces in the figures are planarized just before the end-point. A few shallow scratches due to particle abrasion of the soft Cu surfaces are evident in FIGS. 13A and 13B. In the case of overpolishing, dishing occurs on the Cu lines, which appears dark in the AFM due to its low position relative to the surrounding oxide surface. For features with λ=1 and 2 μm (or higher Cu area fraction, $A_f$=0.5 and 0.25), the amount of dishing was less than 30 nm after overpolishing. In comparison, dishing was very significant which was about 200 nm for the isolated line feature with 200 μm pitch. Significant rounding also occurred at the edges of oxide for the isolated line structures.

Table 4 lists the amount of dishing at different durations for structures on the center die of the test wafer. Before 3 minutes, when the surface is still covered with a thin layer of Cu, dishing does not initiate. The onset of dishing depends on the pattern geometry, characterized by the linewidth and the area fraction of Cu (or the pitch). From an earlier observation, dishing initiates at the time when Cu is polished through. Since Cu is not cleared at the same time for features with different linewidth, or area fraction, the onset of dishing varies with the same parameters. The time variation for the onset of dishing is about 1 minute for all patterns. In practice, this variation will require overpolishing part of the wafer in order to clear all the Cu on the oxide surface, and therefore creates surface nonuniformity. The rates of dishing that resulted from the least square method for the data are listed in Table 4. The normalized rate of dishing, ranging from 0.04 to 1.39, is defined as the rate of dishing divided by the Cu blanket polishing rate, about 210 nm/min.

TABLE 4

Experimental Results of Dishing Evolution

| Pitch, λ (μm) | Linewidth, ω (μm) | ω/λ | \multicolumn{5}{c}{Amount of Dishing at Different Duration (nm)} | Rate of Dishing (nm/min) | Normalized Rate of Dishing |
|---|---|---|---|---|---|---|---|---|---|
| | | | 3 min | 3.5 min | 4 min | 5 min | 6 min | | |
| 1 | 0.5 | 0.50 | 0 | 0 | 0 | 26.6 | 18.5 | 9.3 | 0.04 |
| 2 | 0.5 | 0.25 | 0 | 0 | 0 | 27.5 | 71.3 | 35.7 | 0.17 |
| 4 | 0.5 | 0.125 | 0 | 16.4 | 27.6 | 36.4 | 92.1 | 27.7 | 0.13 |
| | 2.0 | 0.50 | 0 | 26.7 | 13.6 | 30.8 | 34.2 | 9.4 | 0.04 |
| 10 | 0.5 | 0.05 | 0 | 12.3 | 34.5 | 42.0 | 154.0 | 46.7 | 0.22 |
| 50 | 0.5 | 0.01 | 0 | 0 | 0 | 112.4 | 228.2 | 114.1 | 0.54 |
| | 25.0 | 0.50 | 0 | 150.0 | 120.0 | 113.0 | 143.5 | 28.8 | 0.14 |
| 100 | 1.0 | 0.01 | 0 | 65.3 | 16.5 | 158.0 | 267.1 | 87.5 | 0.42 |
| 200 | 0.5 | 0.0025 | 0 | 0 | 0 | 215.7 | 284.5 | 142.5 | 0.68 |
| | 0.7 | 0.0035 | 0 | 0 | 0 | 254.7 | 359.5 | 179.8 | 0.86 |
| | 2.0 | 0.01 | 0 | 127.6 | 200.0 | 273.4 | 395.7 | 121.0 | 0.58 |
| | 5.0 | 0.025 | 0 | 225.0 | 123.3 | 546.3 | 786.5 | 259.1 | 1.23 |
| | 25.0 | 0.125 | 0 | 183.5 | 400.0 | 628.3 | 705.0 | 236.5 | 1.13 |
| | 100.0 | 0.5 | 0 | 200.0 | 215.0 | 364.5 | 445.5 | 135.9 | 0.65 |
| 500 | 5.0 | 0.01 | 0 | 243.8 | 398.0 | 847.5 | 878.5 | 292.3 | 1.39 |

Figure 14:
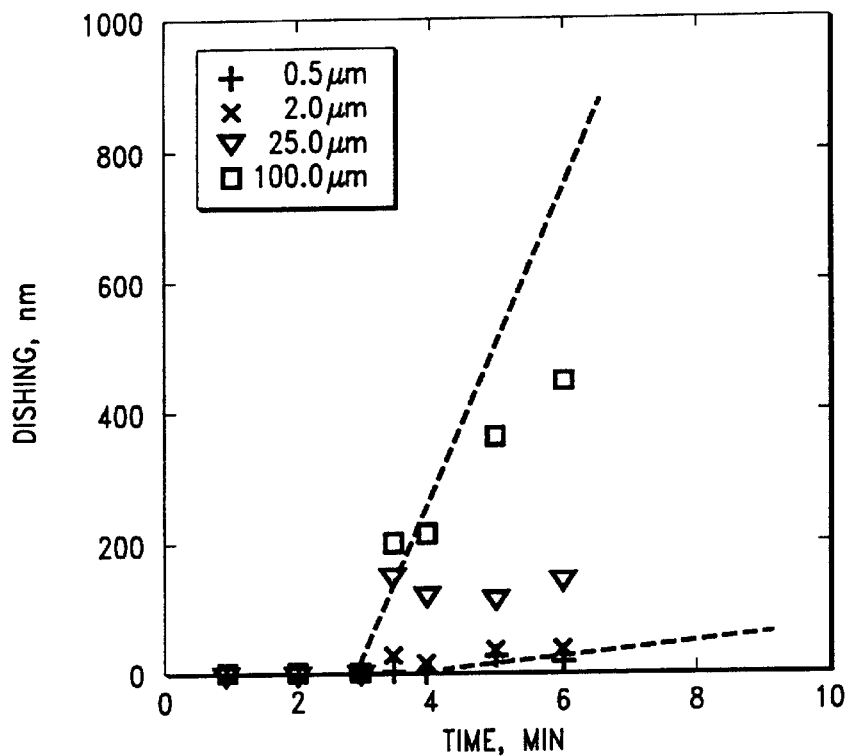
FIG. 14 is a graph illustrating the time evolution of copper dishing for patterns with constant area fraction w/λ of 0.5.

FIG. 14 illustrates the effects of linewidth on dishing for 0.5 area fraction features, which is close to the present circuit design. For small linewidth features such as 0.5, 1 or even 25 μm lines, the amount of dishing leveled off after a short period of overpolishing. The constant dishing levels for 0.5 and 2 μm lines were about 20 to 30 nm. Moreover, the rates of dishing were bounded by blanket Cu and oxide polishing rates. For 0.5 and 2 μm wide lines, the rate of dishing was close to the blanket oxide polishing rate, about 12 nm/min. For larger linewidth such as 100 μm, however, dishing increased with overpolishing time and did not reach a constant level (steady state) within the comparatively long overpolishing period in experiments. The dishing amount was about 450 nm after three minutes of overpolishing. Thus the dishing rate was about 150 nm/min which was close to the polishing rate of blanket Cu, about 210 nm/min.

Dishing was as slow as oxide removal rate for small features since the surrounding oxide constrained the polishing of fine Cu lines. The pad did not deform sufficiently into the small trenches. For instance, for a pattern with small linewidth and modest area fraction such as the 0.5 nm line with $A_f$=0.5, the pad displacement into low was about 0.08 nm and almost neglected compared to the pad roughness. It was expected that the amount of dishing must be comparable to the sum of pad displacement and the indentation depth of the particle if no chemical reaction was involved. Based on experiment results, the indentation depth was about 10 to 20 nm for 300 nm $Al_2O_3$ abrasive at normal CMP conditions. Therefore, the maximum dishing was expected to be about 20 nm, which agreed with the measurements.

When the Cu line was wide enough the pad easily conformed with the dished Cu surface and applied uniform pressure on both Cu and oxide surfaces as on the blanket wafer. For example, at 100 μm, the pad deformed into the dished area without the constraint of surrounding oxide. Consider even a large amount of dishing occurred, such as 300–400 nm in 100 μm lines (with the consideration of pad deformation, pad roughness and particle size), the ratio of dishing to linewidth was still very small, about 0.004. For such a small difference of strain between Cu and oxide contact regions, the normal pressure was assumed uniform, i.e. $p_{Cu} \approx p_{Oxide} \approx p$. Hence, the dishing rate was close to the blanket Cu polishing rate, about 220 nm/min. Moreover, for a design with Cu depth of 1 μm, more than 40% of Cu was lost due to dishing in the worst case.

Figure 15:
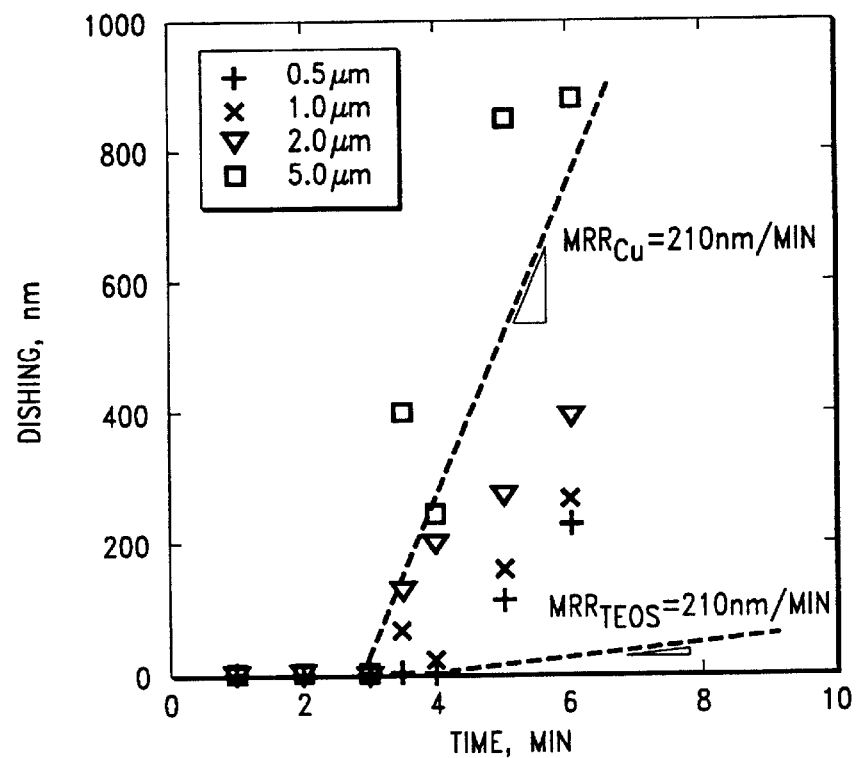
FIG. 15 is a graph illustrating the time evolution of copper dishing for patterns with constant area fraction w/λ of 0.01 and various linewidths w.

FIG. 15 illustrates the effects of linewidth on the dishing behavior of isolated lines with $A_f$=0.01. The trend was similar to those on area fraction 0.5: dishing increases with overpolishing time and its rate was bounded by blanket Cu and oxide polishing rates. The amount and the rate of dishing on isolated lines increased compared to those on 0.5 area fraction lines. The rate of dishing increased about 14 times for both 0.5 and 2 μm features, and smaller for 5 μm or larger features. However, it was not so significant when the fifty-times decrease on the area fraction was considered. Additionally, dishing on small Cu lines such as 0.5 and 2 μm ones did not reach a steady state with about two and a half minutes of overpolishing.

Figure 16:
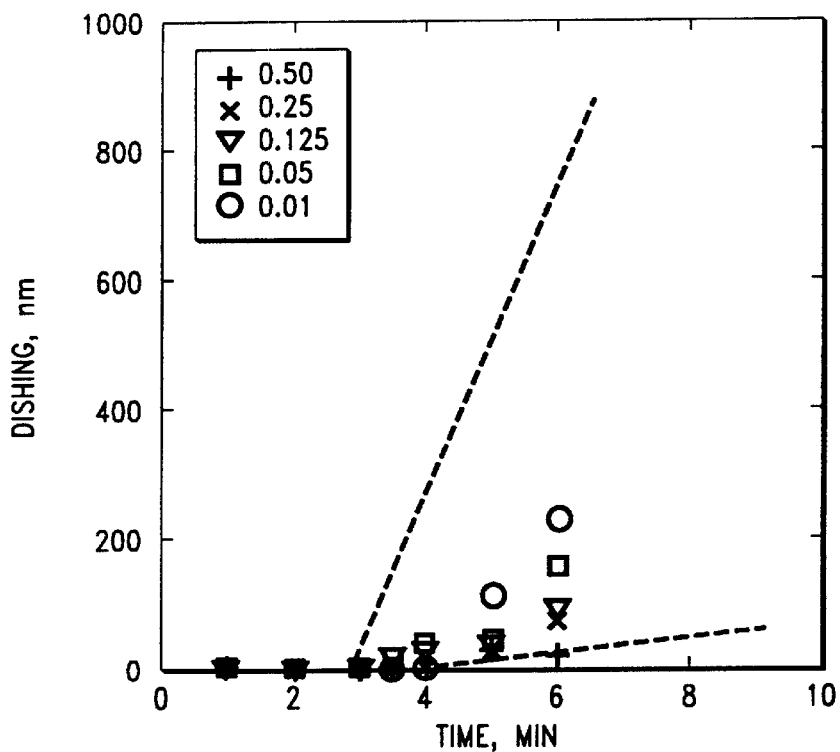
FIG. 16 is a graph illustrating the time evolution of copper dishing for patterns with constant linewidths w of 0.5 μm and various area fractions w/λ.

FIG. 16 illustrates the effects of area fraction on dishing for 0.5 μm lines. It was confirmed that the area fraction did not affect dishing significantly. For area fraction ranging from 0.01 to 0.5, the rates of dishing were all close to the blanket oxide polishing rate. It was also shown that, except for the one with the very low 0.01 area fraction, dishing stayed at low level less than 35 nm, even with two-minute overpolishing.

Figure 17:
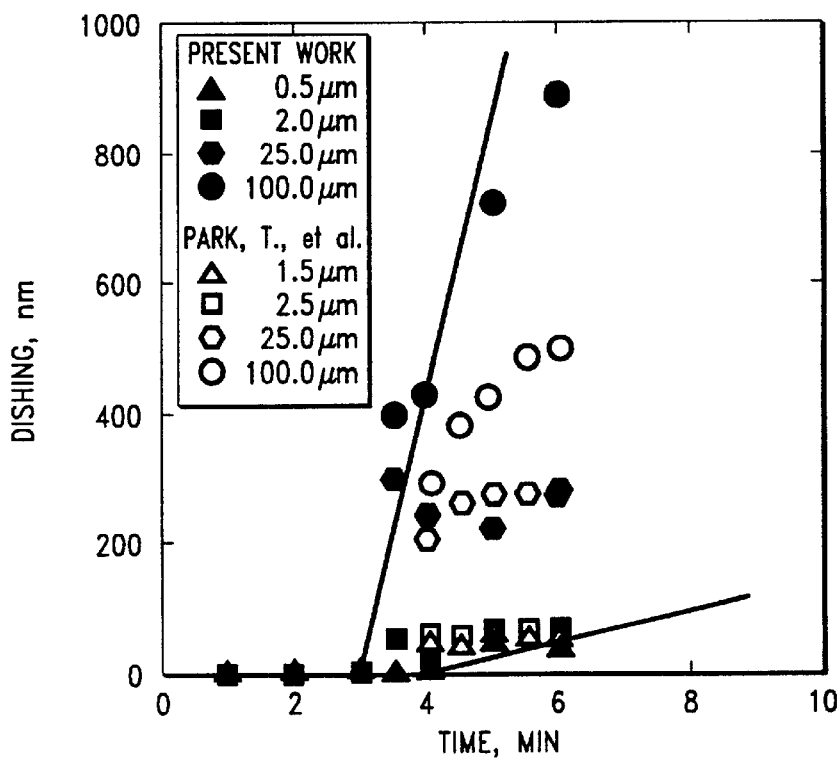
FIG. 17 is a graph illustrating the comparison of the present invention using neutral slurry and the prior art using a chemical slurry.

FIG. 17 illustrates the comparison of the present invention using neutral slurry and the prior art using commercial chemical slurry (Park et al., 1999) on features with 0.5 area fraction. It is apparent that the dishing behavior was not affected by the presence of chemicals in the slurry, which was about less than 25 μm. In both experiments, dishing reaches the same steady-state level after overpolishing for about 1 minute. However, for a wide Cu area, for example 100 μm, dishing rate was reduced by properly tailoring the slurry pH and chemistry. The dishing amount was reduced by half from 450 nm to 230 nm after 3 minutes of overpolishing. Even for a short period of one minute overpolishing, dishing was reduced by a factor of 0.65 by using chemical slurry. These results suggested that the effect of chemistry on dishing depended on the assistance of mechanical particle abrasion. The pure chemical etching was not very significant in the Cu polishing process. For small lines, the material removal due to particle abrasion decreased with the increase of dishing because of the decrease of load on the particle. Thus the chemical effect of altering the hardness of surface material was not significant to the reduction of Cu dishing rate. On the contrary, the pressure distribution was a lot more uniform and did not change much with the increase of dishing because the pad conformed with dished surfaces. Thus the change rate of surface properties by chemistry can change the rate of dishing, similar to the results observed on the blanket wafer.

Figure 18:
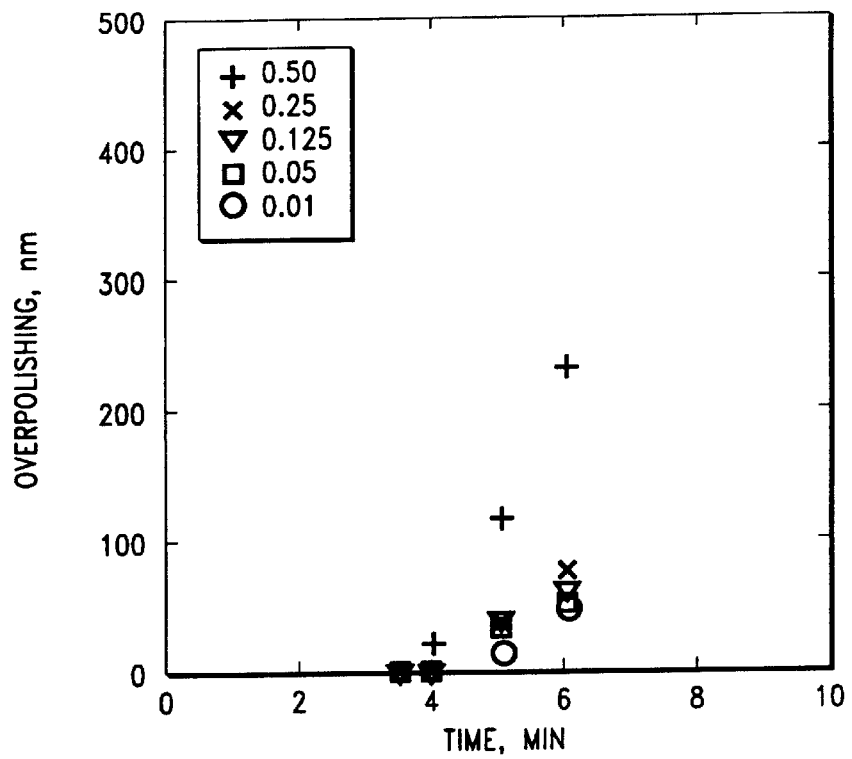
FIG. 18 is a graph illustrating the time evolution of oxide overpolishing for patterns with a constant linewidth w of 0.5 μm and various area fractions w/λ.

FIG. 18 illustrates the amount of oxide overpolishing versus the polishing time for constant linewidth of 0.5 μm and various area fractions. Oxide overpolishing started when the Cu layer was polished through, which depended on the geometry of pattern. In this case, it varied from 3 minutes to 4 minutes of polishing for different patterns on the die. The amount of overpolishing increased with overpolishing time. It showed that the overpolishing rate increased with pattern area fraction. For small area fraction such as 0.01, 0.05, and 0.125, the rate of overpolishing was similar and close to the rate of blanket oxide polishing. For area with larger area fraction such as 0.25 and 0.5, the rate of overpolishing increased with area fraction.

Figure 19:
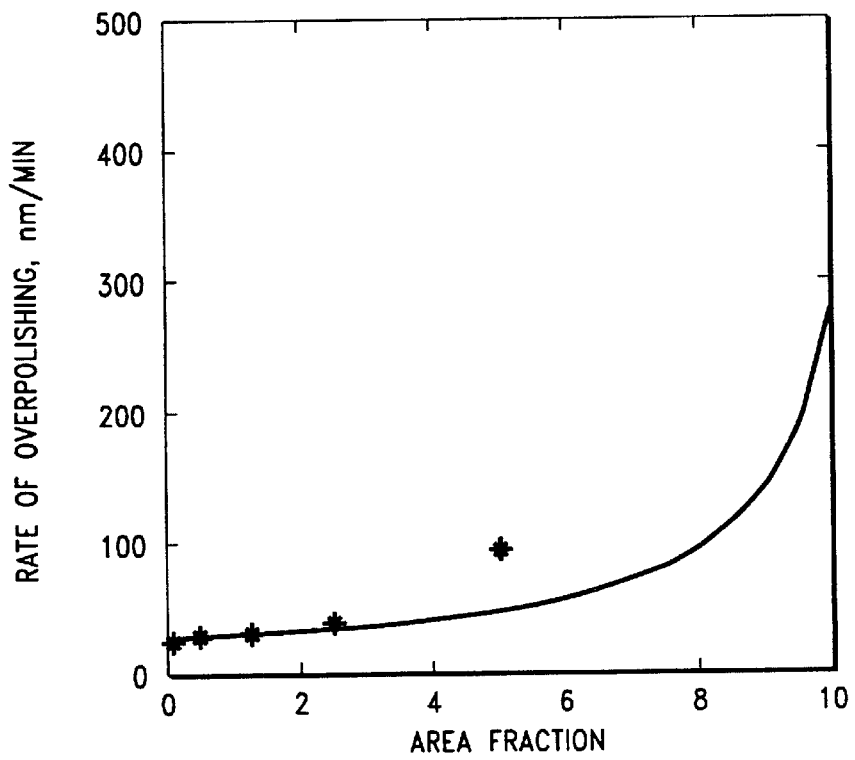
FIG. 19 is a graph illustrating the comparison between the theoretical and experimental results for rate of oxide overpolishing for various patterns with a constant linewidth w of 0.5 μm and various area fractions w/λ.

FIG. 19 illustrates the comparisons between analytical and experimental results for the effect of area fraction on the rate of overpolishing. The solid line represents the analytical results of Equation (24) with blanket polishing of Cu and oxide at 270 and 26 nm/min. It is shown that the experimental results agreed with the model well, especially when the area fraction was less than 0.25. For higher area fraction like 0.5, the rate was higher than that predicted by the model. A possible explanation for this discrepancy was that the slurry transferred more efficiently at the interface on a dense pattern area than that on a blanket area or less dense area. The dished Cu recesses improved the intrinsic rates of material removal of Cu and oxide and thus increased the rate of overpolishing.

Figure 20:
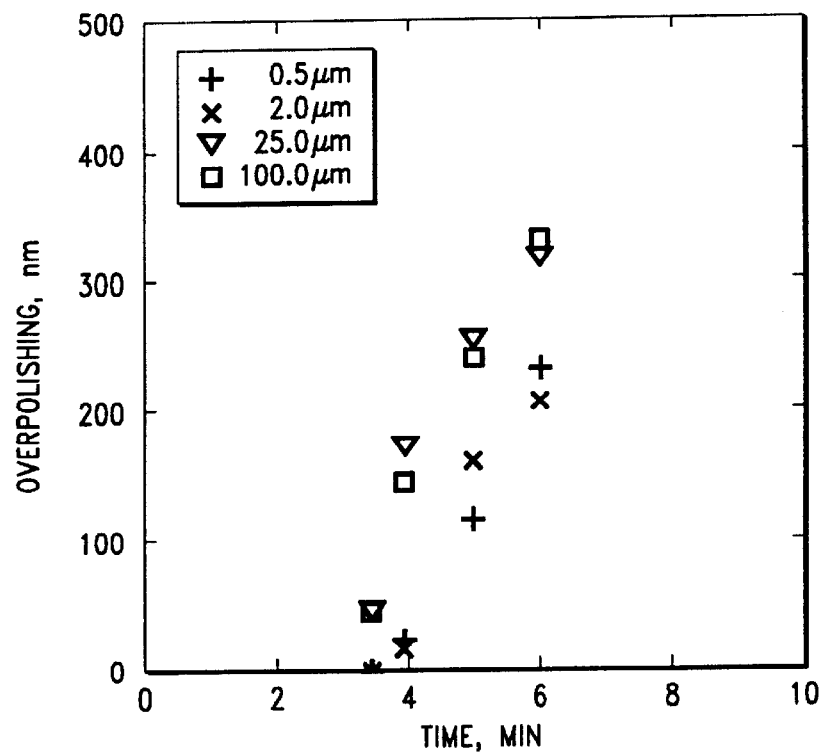
FIG. 20 is a graph illustrating time evolution of oxide overpolishing for patterns with a constant area fraction w/λ of 0.5 and various linewidths w.
Figure 21:
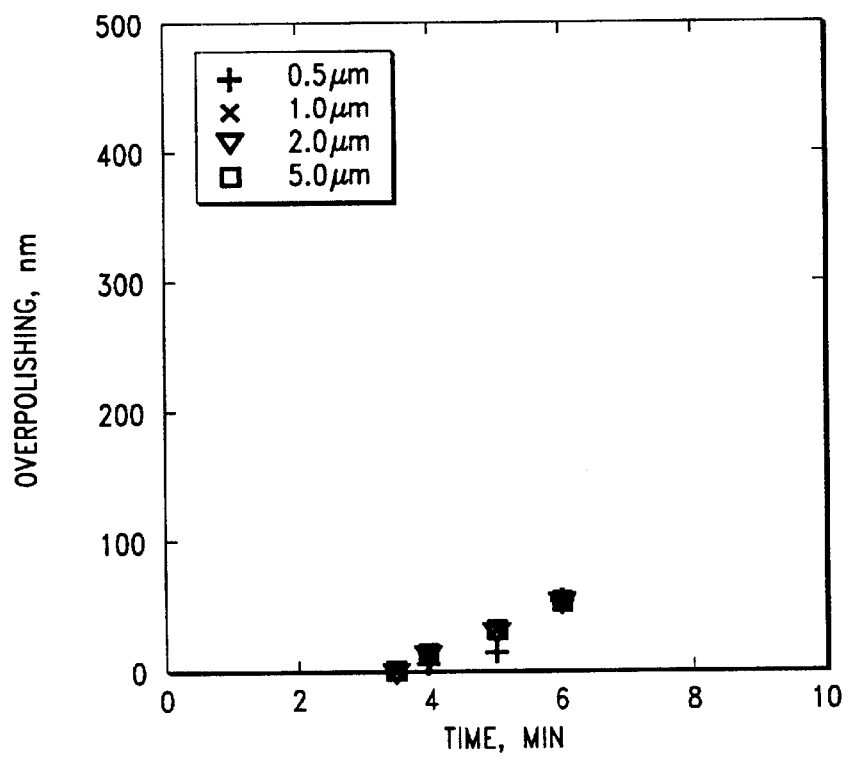
FIG. 21 is a graph illustrating oxide overpolishing for patterns with a constant area fraction w/λ of 0.01 and various linewidths w.

FIGS. 20 and 21 illustrate respectively oxide overpolishing of various patterns with different linewidths and constant area fractions of 0.5 and 0.01. FIGS. 20 and 21 show that overpolishing did not strongly depend on the linewidth for either small or large area fraction. In the case of area fraction 0.5, the rate of overpolishing was about 100 nm/min for linewidths ranging from 0.5 to 100 nm. For smaller area fraction of 0.01, which modeled the area with isolated interconnects on the surface, the oxide overpolishing rate was very close to the blanket rate of oxide polishing, for linewidths ranging from 0.5 to 5 nm. This implied that scaling did not change the pressure distribution on both Cu and oxide very significantly. The pressure distribution on the surface during overpolishing stage essentially was affected by the area fraction only. This was because the average material removal rate across a sub-die area was constrained by the oxide overpolishing rate, which in turn depended on the area fraction of pattern. This also suggested that the pressure distribution on each sub-die area was similar and close to the average pressure applied on the wafer and verified the assumption employed in the earlier theory section.

FIGS. 20 and 21 also show that the oxide overpolishing rate was smaller at the early stage of overpolishing before the steady-state regime. This is explained by the variation of pressure distribution on both the Cu and oxide surface during overpolishing. The pressure was distributed uniformly on both Cu and oxide surface. Since Cu was dished and the surface nonuniformity increased, the pressure on the Cu decreased because the pad was slightly deformed into the dished area and relax stresses on the contacting surface. Based on force equilibrium, the load on the oxide increased and thus the MRR increased until reaching a steady value. The MRR of oxide was bounded by the steady-state rate given by Equation (24) and by the blanket rate (at the stage when the surface was planar).

In Cu CMP, there are two important process requirements within a die area: remaining Cu interconnect thickness and its within-die uniformity which also represents the variation of the surface topography. The remaining Cu thickness at any point at a randomly chosen point k in the j-th sub-die region of the i-th die of the wafer can be expressed as $$h_{ijk} = h_o - (\mu_i + \xi_{j(i)} + \delta_{j(i)} + r_{k(ij)}) \quad (26)$$

where $h_o$ is the initial designed thickness of the Cu interconnect which is the same as the depth of the oxide trench, $\mu_i$ the mean of oxide overpolishing on a specific die i, $\xi_{j(i)}$ the deviation of the amount of oxide overpolishing from $\mu_i$ on the sub-die area j (with the same pattern geometry) on the die i. Therefore, the amount of Cu loss due to overpolishing is the sum of $\mu_i$ and $\xi_{j(i)}$. Also in Equation (26), $\delta_{j(i)}$ is the amount of dishing on the sub-die area j on the die i, and $r_{k(ij)}$ the random error at a specific point k in the sub-die area j on the die i. The random error for each observation in the sub-die area is estimated by randomly choosing n replicates of Cu interconnect thickness. If a specific sub-die with repeat features is larger enough, i.e., the different pattern of a neighboring sub-die will not affect the pressure distribution and slurry flow in most of the sub-die area, the random error represents the error form measurement and other random factors. Equation (26) helps identify the effects of each geometry or process parameters for process optimization.

In order to minimize the Cu loss, each variable on the right side of Equation (26) must be minimized, both mean and variance. The mean of oxide overpolishing, $\mu_i$, is affected by the average Cu area fraction and increases with overpolishing time. And its variance across a wafer increases with the increased within-wafer polishing non-uniformity, which is determined by the global (wafer-scale) factors such as wafer/pad contact conditions, slurry dispensing and pad stiffness. In practice, the average area fraction is limited to 0.3 to 0.5 and does not vary too much for similar IC products. Thus, minimization of $\mu_i$, relies mostly on the reduction of within-wafer polishing non-uniformity so that the overpolishing time required to remove the excess Cu at different dies can be minimized.

As suggested by Equation (26), the rate of overpolishing, $\partial\xi/\partial t$, due to the local pattern layout in the sub-die area is determined by the wear coefficient, Cu area fraction, and the hardness of both Cu and oxide. The arrangement of the sub-die area fraction is usually prescribed by the circuit designers and cannot be changed. In order to minimize the effects of pattern local layout on overpolishing, $\partial\xi/\partial t$ must be adjusted to be as low as possible and/or less sensitive to the local geometry variation in the final polishing stage (or after the onset of overpolishing). The overpolishing rate decreases with the wear coefficient. In one embodiment of the present invention, soft abrasive particles are employed in which the hardness of the abrasive is close to ILD oxide but still higher than that of Cu. Hence less overpolishing will occur even if the overpolishing time for cleaning up all the excess Cu still remains the same. In another embodiment, the hardness of Cu is increased and/or the oxide hardness is reduced (essentially reducing the ratio of Cu MRR to oxide MRR, or the so-called selectivity) by tailoring the slurry pH and chemistry. This will reduce the sensitivity to area fraction variation on the variation of overpolishing rate (or the variation of the "relative hardness" across different sub-dies). Reducing the oxide hardness by increasing slurry pH (but not too high to retard the Cu removal) is better than increasing the Cu hardness because the overpolishing time will not increase. However, an end-point detection scheme should be adopted because the oxide is overpolished at a much faster rate.

The inventors discovered that dishing is strongly related to the Cu linewidth. For sub-micron lines, the rate of dishing is very low (close to oxide blanket rate and is not sensitive to the slurry chemistry) and the steady-state dishing is very small. The effects of dishing on the Cu loss and surface non-uniformity is negligible for current and future circuit designs. However, for some designs with a large metal pad or wide power transmission lines, 50–100 µm wide, dishing rate is close to that in blanket polishing. In these cases, dishing results in Cu loss and surface non-uniformity. It is necessary to increase the Young's modulus of the pad to reduce the pad indentation, or to employ a slightly basic slurry to retard Cu polishing rate but without increasing the oxide overpolishing rate.

One advantage of the CMP method of the present invention is that it is based on contact model for the first step of planarizing and polishing the upper portion of the metal layer, and a steady-state model for the second step of metal dishing and oxide overpolishing. Accordingly, process conditions can be selected for the first step to quickly planarize and polish the initial topography of various patterns ($A_f$ ranging from 0.01 to 0.5) to reach planar surface. After the surface has been planarized, the remaining Cu is removed at a rate close to blanket polishing rate, and the surface variation will remain until part of the Cu is polished through in some sub-die areas. After the Cu is cleared, the surface nonuniformity increases because of dishing and overpolishing. The steady-state model of the second step according to the present invention provides a mechanism to optimize process conditions to reduce metal dishing and oxide overpolishing. Experiments show that linewidth is an important geometrical parameter for dishing. For thin lines, less than 1 µm, the dishing rate is close to oxide blanket rate and might reach a steady-state profile after a short period of overpolishing. For wider lines, about 50 to 100 µm, the Cu is dished at a rate close to the blanket rate. Compared with the prior art, the slurry pH and chemicals do not increase the amount or rate of dishing for small lines, but might retard the dishing of wider lines. This implies that the load distribution due to the deformation of the pad and mechanical action of the particles play an important role in Cu dishing, especially for small lines. Oxide overpolishing depends more on pattern area fraction but less on linewidth. Experiments show that overpolishing reaches a steady-state rate after a short period. The steady-state rate of overpolishing is dependent on the apparent hardness and the intrinsic wear coefficients of Cu and oxide. Experiments also show that for a pattern with large fraction, the overpolishing rate may increase more than that predicted by the model due to the improvement of slurry transport. Moreover, since overpolishing does not depend on linewidth significantly, when the device scale shrinks down, the within-die nonuniformity will mainly attribute to the overpolishing but not dishing if a large variation area fraction is shown on pattern layout.

The present CMP method can be used to maximize Cu removal rate and reduce surface nonuniformity due to dishing and overpolishing. The present method reduces oxide overpolishing and minimize the variance of dishing and overpolishing resulting from the effects of different area fraction and linewidth. Thus the surface topography will not be uneven even with a short period of overpolishing.

The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

We claim:

1. A method of chemical mechanical polishing of a metal damascene structure which includes an insulation layer having trenches formed on a wafer, and a metal layer having a first portion in and above the trenches and a second portion overlying the rest of the insulation layer, comprising:
    a first step of planarizing the first and second portion of the metal layer by urging the wafer with a polishing pad at an applied pressure and a relative velocity in a contact mode between the wafer and the polishing pad; and
    a second step of polishing the first and second portion of the metal layer in a steady-state mode to form individual metal lines in the trenches.

2. The method of claim 1 wherein said second step of polishing is controlled by controlling wear coefficient.

3. The method of claim 2 wherein the wear coefficient is controlled by using a polishing slurry containing abrasive particles having a hardness close to the hardness of the insulation layer and higher than the hardness of the metal.

4. The method of claim 1 wherein in said second step of polishing comprises increasing the hardness of the metal.

5. The method of claim 1 wherein said second step of polishing comprises reducing the hardness of the insulation layer.

6. The method of claim 5 wherein the hardness of the insulation layer is reduced by controlling the pH and/or composition of a polishing slurry.

7. The method of claim 1 further comprising a step of controlling within-wafer polishing uniformity.

8. The method of claim 7 wherein the within-wafer polishing uniformity is controlled by controlling contact conditions of the wafer and the pad, dispensing conditions of a polishing slurry and the stiffness of the pad.

9. A method of chemical mechanical polishing of a metal damascene structure which includes an insulation layer having trenches on a wafer and a metal layer having a first portion in and above the trenches and a second portion overlying the rest of the insulation layer, comprising:
    a first step of planarizing the first and second portion of the metal layer by urging the wafer with a polishing pad at an applied pressure $P_{av}$ and a relative velocity $v_R$ in a contact mode between the wafer and the polishing pad; and
    a second step of polishing the first and second portion of the metal layer in a steady-state mode by satisfying the following equation to form individual metal lines in the trenches, $$R_{Metal} = R_{Insulation} = k_w / H' P_{av} V_R$$

wherein $R_{Metal}$ is copper removal rate, $R_{Insulation}$ is insulation layer removal rate, $k_w$ is wear coefficient, and H' is apparent hardness of a polishing surface represented by the following equation:

$$H' = H_{Metal} A_f + H_{Insulation}(1 - A_f)$$

wherein $H_{Metal}$ is hardness of copper, $H_{Insulation}$ is hardness of the insulation layer, and $A_f$ is area fraction of the metal pattern.

10. The method of claim 9 wherein the apparent hardness H' is designed uniformly cross a die area on the wafer.

11. The method of claim 9 wherein said second step of polishing is controlled by controlling the wear coefficient $k_w$.

12. The method of claim 9 wherein the wear coefficient $k_w$ is controlled in said second step by using a polishing slurry containing abrasive particles having a hardness close to the hardness of the insulation layer $H_{Insulation}$ and higher than the hardness of the metal $H_{Metal}$.

13. The method of claim 9 wherein the second step of polishing comprises increasing the hardness of the metal $H_{Metal}$.

14. The method of claim 9 wherein the second step of polishing comprises reducing the hardness of the insulation layer $H_{Insulation}$.

15. The method of claim 9 wherein the hardness of the insulation layer $H_{Insulation}$ is reduced by controlling the pH and/or composition of a polishing slurry.

16. The method of claim 9 further comprising a step of controlling within-wafer polishing uniformity.

17. The method of claim 9 wherein the within-wafer polishing uniformity is controlled by controlling contact conditions of the wafer and the pad, dispensing conditions of a polishing slurry and the stiffness of the pad.

18. The method of claim 9 wherein the metal damascene structure has an area fraction $A_f$ of 0.5 and the metal lines in the trenches have a linewidth w from 0.5 to 25 μm, and the total polishing time for said first and second steps is from 180 to 300 seconds.

19. The method of claim 9 wherein the metal damascene structure has an area fraction $A_f$ of 0.5 and the metal lines in the trenches have a linewidth w from 50 to 100 μm, and the total polishing time for said first and second steps is from 180 to 210 seconds.

20. The method of claim 9 wherein the metal lines in the trenches have a linewidth w of 0.5 μm, the metal damascene structure has an area fraction $A_f$ between 0.05 and 0.5, and the total polishing time for the first and second steps is from 180 to 300 seconds.

21. The method of claim 9 wherein the metal lines in the trenches have a linewidth w of 0.5 μm and the metal damascene structure has an area fraction $A_f$ of less than 0.01, and the total polishing time for said first and second steps is from 180 to 210 seconds.

* * * * *

UNITED STATES PATENT AND TRADEMARK OFFICE
CERTIFICATE OF CORRECTION

PATENT NO. : 6,667,239 B2
DATED : December 23, 2003
INVENTOR(S) : Saka et al.

It is certified that error appears in the above-identified patent and that said Letters Patent is hereby corrected as shown below:

<u>Title page,</u>
Item [73], Assignee, replace "ASML, US, Inc., Scotts Valley, CA (US)" with
-- ASML, US, Inc., Scotts Valley, CA (US) and Massachusetts Institute of Technology, Cambridge, MA (US). --.

Signed and Sealed this

Sixth Day of September, 2005

JON W. DUDAS
*Director of the United States Patent and Trademark Office*